(12) United States Patent
Nakura et al.

(10) Patent No.: US 8,411,487 B2
(45) Date of Patent: Apr. 2, 2013

(54) SEMICONDUCTOR MEMORY DEVICE

(75) Inventors: Mitsuru Nakura, Osaka (JP); Kazuya Ishihara, Osaka (JP); Shinobu Yamazaki, Osaka (JP); Suguru Kawabata, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 17 days.

(21) Appl. No.: 13/224,814

(22) Filed: Sep. 2, 2011

(65) Prior Publication Data

US 2012/0075911 A1    Mar. 29, 2012

(30) Foreign Application Priority Data

Sep. 24, 2010 (JP) ................................ 2010-214009

(51) Int. Cl.
*G11C 11/00* (2006.01)
(52) U.S. Cl. .............. 365/148; 365/185.22; 365/185.11; 365/185.29; 365/230.06
(58) Field of Classification Search .................. 365/148, 365/185.22, 185.11, 185.29, 185.19, 230.06
See application file for complete search history.

(56) References Cited

U.S. PATENT DOCUMENTS

| | | | |
|---|---|---|---|
| 6,815,744 B1 | 11/2004 | Beck et al. | |
| 7,715,220 B2 | 5/2010 | Tsushima et al. | |
| 2010/0118592 A1* | 5/2010 | Ishihara et al. | 365/148 |

FOREIGN PATENT DOCUMENTS

| | | |
|---|---|---|
| JP | 2002-537627 | 11/2002 |
| JP | 2007-328857 | 12/2007 |

OTHER PUBLICATIONS

H. Pagnia et al., "Bistable Switching in Electroformed Metal-Insulator-Metal Devices", Phys. Stat. Sol. (a), vol. 108, pp. 11-65, 1988.
Baek I.G. et al., "Highly Scalable Non-volatile Resistive Memory using Simple Binary Oxide Driven by Asymmetric Unipolar Voltage Pulses", IEDM2004, pp. 587-590, 2004.

* cited by examiner

*Primary Examiner* — Thong Q Le
(74) *Attorney, Agent, or Firm* — Nixon & Vanderhye, P.C.

(57) ABSTRACT

Regardless of a resistance state of a variable resistance element of a memory cell that is a target of a writing action (erasing and programming actions), an erasing voltage pulse for bringing the resistance state of the variable resistance element to an erased state having a lowest resistance value is applied. Thereafter, a programming voltage pulse for bringing the resistance state of the variable resistance element to a desired programmed state is applied to the variable resistance element of the programming action target memory cell. By always applying the programming voltage pulse after having applied the erasing voltage pulse, a plurality of programming voltage pulses being sequentially applied can be avoided. Further, the memory cell array is constituted of even-numbers of subbanks, and the application of the erasing voltage pulse in one subbank and the application of the programming voltage pulse in the other subbank are alternately performed.

14 Claims, 17 Drawing Sheets

SEMICONDUCTOR MEMORY DEVICE

CROSS REFERENCE TO RELATED APPLICATION

This Nonprovisional application claims priority under 35 U.S.C. §119(a) on Patent Application No. 2010-214009 filed in Japan on Sep. 24, 2010 the entire contents of which are hereby incorporated by reference.

BACKGROUND OF THE INVENTION

1. Field of the Invention

The present invention relates to a semiconductor memory device including a memory cell array configured of memory cells, a plurality of which is arranged respectively in a row direction and a column direction, each memory cell including a variable resistance element that stores information based on an electric operational property in which an electric resistance changes by application of electric stress.

2. Description of the Related Art

A non-volatile memory represented by a flash memory is used as a large-capacity and compact information storing medium in various fields such as computers, communications, measuring appliances, automatic controllers and living appliances used around a user, and a demand for a non-volatile memory that is cheaper and has larger capacity is extremely large. This is because it can perform a function as a memory card that can easily be carried around, or data storage or a program storage, etc. that stores initial settings for device operation such as a cell phone in a non-volatile manner, due to being capable of being electrically written and that data is not erased even when the power is turned off.

Note that, since the flash memory requires longer time for an erasing action of erasing data to a logical value "0" compared to a programming action of programming data to a logical value "1", it is not capable of high-speed operation. In regard to the erasing action, when the erasing action is performed, although improvement in speed is attempted by performing in a unit of a few bytes or a block unit, there is a problem that a random access programming cannot be performed since the erasing action is performed in the unit of the few bytes/block unit.

Due to this, currently a new type of non-volatile memory that replaces the flash memory is being widely studied. Among such, a resistance change memory that uses a phenomenon in which a resistance change occurs due to application of a voltage to a metal oxide film is useful compared to the flash memory in regards to a scaling limit, and since it is capable of a high-speed data writing, it is frequently researched and developed in the recent years (e.g., refer to Japanese Unexamined Patent Application Publication (Translation of PCT Application) No. 2002-537627, or H. Pagnia et al., "Bistable Switching in Electroformed Metal-Insulator-Metal Devices", Phys. Stat. Sol. (a), vol. 108, pp. 11-65, 1988, and Baek I. G. et al., "Highly Scalable Nonvolatile Resistive Memory using Simple Binary Oxide Driven by Asymmetric Unipolar Voltage Pulses", IEDM2004, pp. 587-590, 2004).

As programming/erasing properties of such a variable resistance element having the metal oxide, in a case with a driving method called bipolar switching, since the electric resistance of an element increases (high resistance state)/decreases (low resistance state) by applying voltage pulses with opposite polarity respectively to the element, it can be used as a memory by assigning a logical value as data to each electric resistance state.

As a feature of the variable resistance element having the metal oxide, it is capable of the high-speed random access programming/erasing.

For example, a case in which the random access programming/erasing is performed on the variable resistance element that stores two values of "0" and "1" will be considered. In performing the programming/erasing action regardless of the resistance state of the memory cell, an erasing action applying an erasing voltage pulse to the element in a programmed state or a programming action applying a programming voltage pulse to the element in an erased state will be appropriate actions, however, a programming action applying the programming voltage pulse to the element already in the programmed state or an erasing action applying the erasing voltage pulse to the element already in the erased state will be overwriting to the original states.

Property variability of the elements is likely to be influenced by such an operation hysteresis, and depending on the resistance state, there is a possibility that data is written due to a change in the electric resistance by the overwriting being performed. Further, when the operation hysteresis of the elements is large, the property variability between elements becomes larger, and becomes a cause of data errors.

In actually using the variable resistance elements as a memory, since there is a possibility that a programming action failure occurs due to the variability in the element properties or a variability in application voltages or application currents in the programming action, a verifying action of verifying whether or not the resistance property of the variable resistance element to which the writing action had been performed has shifted to a desired resistance distribution range will be necessary. Then, as a result of having performed the verifying action, if the programming action failure actually occurs, the programming action needs to be performed by applying the writing voltage pulse again so that the resistance property of the variable resistance element is brought to be within the desired resistance distribution range.

However, when the voltage pulse for the programming action is applied again to the variable resistance element whose resistance property is not within the resistance distribution range of the correct resistance state, since the programming action is overwriting for the variable resistance element, it cannot be programmed to the desired resistance distribution range by the electric resistance being lowered.

On the other hand, the programming property of a variable resistance element represented by a metal oxide variable resistance element exhibits a resistance hysteresis curve as in FIG. 17. FIG. 17 is a diagram showing a relationship between an absolute value of the programming voltage pulse applied to the variable resistance element and the resistance value after a change caused by the voltage pulse. As shown in FIG. 17, the resistance value increases accompanying the increase in the application voltage up to a certain programming voltage, however, the resistance value decreases accompanying the increase in the application voltage thereafter.

Accordingly, the electric resistance value greatly changes after the programming by the programming voltage applied to the variable resistance element, and for some variable resistance elements, a subtle difference in the application voltage gives rise to a great difference in the electric resistance. This applies not only to the applied programming voltages but also to applied programming currents, and the resistance value after the programming greatly changes depending on the magnitude of the applied programming currents.

As shown in FIG. 17, although the electric resistance after the writing action does not rise up to a peak value when the application voltage is low, the electric resistance is decreased when the application voltage is too high. The peak value of the electric resistance and the application voltage by which the electric resistance value is brought to its peak have element variability among the respective variable resistance elements, and even if the application voltage pulse is identical, since the variability in the voltage that is actually applied occurs for each element e.g. due to the position of the variable resistance elements within the memory cell array, it becomes difficult to program such that the resistance property after the application of the voltage pulse is brought to be within the desired resistance distribution range.

SUMMARY OF THE INVENTION

In view of the above conventional problem, an object of the present invention is to provide a semiconductor memory device capable of performing a stable programming to a desired electric resistance state regardless of resistance states of memory cells in performing a programming action.

Further, the object is to provide a semiconductor memory device capable of shortening a programming time and performing a high-speed programming action on memory cells in performing the programming action to the plurality of selected memory cells.

The semiconductor memory device according to the present invention has a first feature of including a memory cell array formed of memory cells, a plurality of which is arranged respectively in a row direction and a column direction, each memory cell including a variable resistance element in which an electrode is supported at each of two terminals of a variable resistor, a resistance state is defined by a resistance property between the two terminals and transitions between two or more different resistance states by applying electric stress between the two terminals, and one resistance state after the transition is used for storing information. The memory cell array is divided into a plurality of subbanks. Each of the subbanks include: common word lines each connecting the memory cells in the same row, and common bit lines each connecting the memory cells in the same column; a row decoder that applies a voltage to the word lines of the subbank; and a column decoder that applies a voltage to the bit lines of the subbank. In a writing of selected memory cells in the memory cell array, one of an erasing action and a programming action is performed on each of the selected memory cells. In the erasing action, an erasing voltage pulse for transitioning the resistance state of the variable resistance element of the memory cell to an erased state having a lowest resistance value is applied to the selected memory cell, regardless of the resistance state of the variable resistance element of the selected memory cell. In the programming action, the erasing voltage pulse is applied to the selected memory cell, and a first programming voltage pulse for transitioning the resistance state of the variable resistance element of the memory cell from the erased state to a predetermined resistance state is applied to the selected memory cell, regardless of the resistance state of the variable resistance element of the selected memory cell. The semiconductor memory device further includes a control circuit that controls an application of the first programming voltage pulse in the programming action to one of two memory cells, and an application of the erasing voltage pulse in the erasing action or the programming action to the other of the two memory cells so that the applications are performed in an identical action cycle with respect to the two memory cells, which belong to the different subbanks, of the selected memory cells.

Further, the semiconductor memory device according to the present invention has a second feature, in addition to the first feature, that an initial verifying action of reading the resistance state of the variable resistance element of the selected memory cell is not performed prior to performing the erasing action or the programming action.

According to the semiconductor memory device of the above first or second feature, in the programming (increasing the resistance) of the selected memory cells, the erasing voltage pulse is applied to cause the transition to the resistance state with the lowest resistance regardless of the resistance states of the variable resistance elements of the memory cells, and thereafter, the programming voltage pulse is applied to cause the transition to the high resistance state. Further, in the erasing (decreasing the resistance) of the selected memory cells also, the erasing voltage pulse is applied to cause the transition to the low resistance state regardless of the resistance states of the variable resistance elements of the memory cells.

Although details will be described later, the variable resistance element that uses metal oxide as the variable resistor has an undesirable property that the resistance value after application of a pulse decreases when the programming voltage pulse for bring the memory cell to an even higher resistance state is applied to a memory cell that is in the highest resistance state. On the other hand, even when the erasing voltage pulse for bring the memory cell to an even lower resistance state is applied to a memory cell that is in the lowest resistance state, the resistance value after the application of the pulse hardly changes.

This means that the variable resistance elements significantly receives the influence of the overwriting with respect to the application of the programming voltage pulse (hereinafter occasionally referred to as a "program overwriting"), whereas they have durability against the overwriting with respect to the application of the erasing voltage pulse (hereinafter occasionally referred to as an "erasure overwriting"). By utilizing this feature, the present invention can realize programming and erasing actions that can easily be controlled to bring the resistance property of the resistance state to the desired distribution range.

In the present invention, the erasing voltage pulse is applied to the writing target memory cell regardless of the resistance state before the application of the pulse. Due to this, in the case where the resistance state before the application of the pulse is in the resistance state with the lowest resistance (erased state), the erasing voltage pulse will be applied to the variable resistance element in the erased state, however, as described above, since the variable resistance element have the durability against the erasure overwriting, the resistance property that is in the low resistance state will not be brought to be a high resistance, and the resistance property is maintained within the distribution range of the desired low resistance state. Further, in the case of bringing the same to the high resistance state (programmed state), since the programming action is performed by always applying the programming voltage pulse after having applied the erasing pulse, the occurrence of the program overwriting is avoided, and a stable programming and erasing actions can be realized.

Further, since the wiring is performed by applying the erasing voltage pulse regardless of the resistance state of the variable resistance element before the application of the pulse, the initial verifying action of reading the resistance state of the variable resistance element before the application of the pulse becomes unnecessary.

Further, in the present invention, the memory cell array is divided into a plurality of subbanks, a subbank onto which the erasing voltage pulse is applied and a subbank onto which the first programming voltage pulse or the second programming voltage pulse is applied are switched, and the applications of the erasing voltage pulse and the programming voltage pulse are made to be successively parallel by a pipeline scheme, thereby a high-speed data update is enabled, and the latency of the programming action is shortened.

Further, the semiconductor memory device according to the present invention has a third feature, in addition to any of the above features, of further including a verification section that performs, after having performed the programming action, a verifying action of verifying whether or not the resistance property of the variable resistance element of the selected memory cell is within a resistance distribution range of the predetermined resistance state. In the verifying action, in a case where the selected memory cell of which the resistance property of the variable resistance element is outside the resistance distribution range of the predetermined resistance state is detected, a second programming action is repeatedly performed until the resistance property of the variable resistance element of the memory cell that is outside the resistance distribution range is brought to be within the resistance distribution range of the predetermined resistance state, and in the second programming action, regardless of the resistance state of the variable resistance element of the memory cell that is outside the resistance distribution range, the erasing voltage pulse is applied to the memory cell and a second programming voltage pulse for transitioning the resistance state of the variable resistance element of the memory cell that is outside the resistance distribution range from the erased state to the predetermined resistance state is applied to the memory cell.

According to the semiconductor memory device of the above third feature, even in the case of performing the programming again on the memory cells whose resistance properties are not within the desired resistance range due to a programming action failure after the programming action, since the reprogramming is performed by applying the writing voltage pulse after having applied the erasing voltage pulse, the occurrence of the program overwriting is avoided, and the programming action failure can be suppressed.

Further, the semiconductor memory device according to the present invention has a fourth feature, in addition to the third feature, that in the case where the second programming action is repeated for a plurality of times, in the second programming action for a first time, the second programming voltage pulse is set to have a smaller absolute value of a voltage amplitude than that of the first programming voltage pulse, or to have a smaller amount of current flow in the variable resistance element when the second programming voltage pulse is applied than when the first programming voltage pulse is applied. In the second programming action for second and subsequent times, the absolute value of the voltage amplitude of the second programming voltage pulse or the amount of current flowing in the variable resistance element when the second programming voltage pulse is applied is increased in steps as a number of times the second programming action is performed increases.

According to the semiconductor memory device of the above fourth feature, it becomes possible to program the resistance properties to the desired resistance range with desirable controllability by taking the element variability of the variable resistance elements, or the positions of the variable resistance elements within the array, into consideration.

Further, the semiconductor memory device according to the present invention has, in addition to any of the above features, a fifth feature that the memory cell array includes one or more pairs of the subbanks constituted of the first subbank and the second subbank, and in the writing of the selected memory cells in the memory cell array, the control circuit is configured to perform: a first action cycle of applying the erasing voltage pulse to the memory cell in the first subbank selected as a target of the erasing action or the programming action and applying the first programming voltage pulse to the memory cell in the second subbank selected as a target of the programming action, and a second action cycle of applying the first programming voltage pulse to the memory cell in the first subbank selected as the target of the programming action and applying the erasing voltage pulse to the memory cell in the second subbank selected as the target of the erasing action or the programming action.

Further, the semiconductor memory device according to the present invention has, in addition to the above fifth feature, a sixth feature that the row decoder is shared between the first subbank and the second subbank in the pair of subbanks, the row decoder simultaneously applies the voltage to the corresponding word lines in the first subbank and the second subbank, and in the writing of the memory cells selected by the corresponding word lines in the first subbank and the second subbank, the bit lines in the first subbank, and the bit lines in the second subbank, in the pair of subbanks, the control circuit is configured to alternately perform the first action cycle and the second action cycle.

Further, the semiconductor memory device according to the present invention has, in addition to the above fifth or sixth feature, a seventh feature that the first action cycle and the second action cycle are performed in synchronization with an external clock.

Further, the semiconductor memory device according to the present invention has, in addition to the above third or fourth feature, an eighth feature that in the writing of the selected memory cells in the memory cell array, the control circuit performs the application of the second programming voltage pulse in the second programming action on the one of the two memory cells, and the application of the erasing voltage pulse in the erasing action, the programming action or the second programming action on the other of the two memory cells in the identical action cycle with respect to the two memory cells, which belong to the different subbanks, of the selected memory cells.

Further, the semiconductor memory device according to the present invention has, in addition to the above eighth feature, a ninth feature that the memory cell array includes a pair of the subbanks constituted of the first subbank and the second subbank, and in the writing of the selected memory cells in the memory cell array, the control circuit is configured to perform: a third action cycle of applying the erasing voltage pulse to the memory cell in the first subbank selected as the target of the erasing action, the programming action, or the second programming action and applying the second programming voltage pulse to the memory cell in the second subbank selected as the target of the second programming action, and a fourth action cycle of applying the second programming voltage pulse to the memory cell in the first subbank selected as the target of the second programming action and applying the erasing voltage pulse to the memory cell in the second subbank selected as the target of the erasing action, the programming action, or the second programming action.

Further, the semiconductor memory device according to the present invention has, in addition to the above ninth feature, a tenth feature that the row decoder is shared between the first subbank and the second subbank in the pair of subbanks, the row decoder simultaneously applies the voltage to the corresponding word lines in the first subbank and the second subbank, and in the writing of the memory cells selected by the corresponding word lines in the first subbank and the second subbank, the bit lines in the first subbank, and the bit lines in the second subbank, in the pair of subbanks, the control circuit is configured to alternately perform the third action cycle and the fourth action cycle.

Further, the semiconductor memory device according to the present invention has, in addition to the above ninth or tenth feature, an eleventh feature that the third action cycle and the fourth action cycle are performed in synchronization with an external clock.

Further, the semiconductor memory device according to the present invention has a twelfth feature, in addition to any of the above features, that each of the memory cells includes a current controlling element connected to the electrode on one terminal of the variable resistor of the variable resistance element, and the current controlling element is a transistor having one of a source and a drain connected to the electrode on the one terminal of the variable resistor.

Further, the semiconductor memory device according to the present invention has a thirteenth feature, in addition to any one of the first to eleventh features, that each of the memory cells includes a current controlling element connected to the electrode on one terminal of the variable resistor of the variable resistance element, and the current controlling element is a diode element having one of an anode and a cathode connected to the electrode on the one terminal of the variable resistor.

Further, the semiconductor memory device according to the present invention has a fourteenth feature, in addition to any of the above features, that the variable resistor is configured by including a metal oxide or oxynitride of at least one of Al, Hf, Ni, Co, Ta, Zr, W, Ti, Cu, V, Zn and Nb.

Therefore, according to the present invention, in the writing of the selected memory cells, by always applying the programming voltage pulse after having applied the erasing voltage pulse and having caused the transition to the low resistance state regardless of the resistance states of the variable resistance elements of the memory cells, a semiconductor memory device that is capable of performing programming so that the resistance states of the variable resistance elements of the memory cells is brought to be within a distribution range of the desired resistance property with the desirable controllability is realized. Further, the latency of the programming action can be shortened by switching the subbank to which the erasing voltage pulse is applied and the subbank to which the programming voltage pulse is applied.

DESCRIPTION OF THE PREFERRED EMBODIMENTS

First Embodiment

Figure 1:
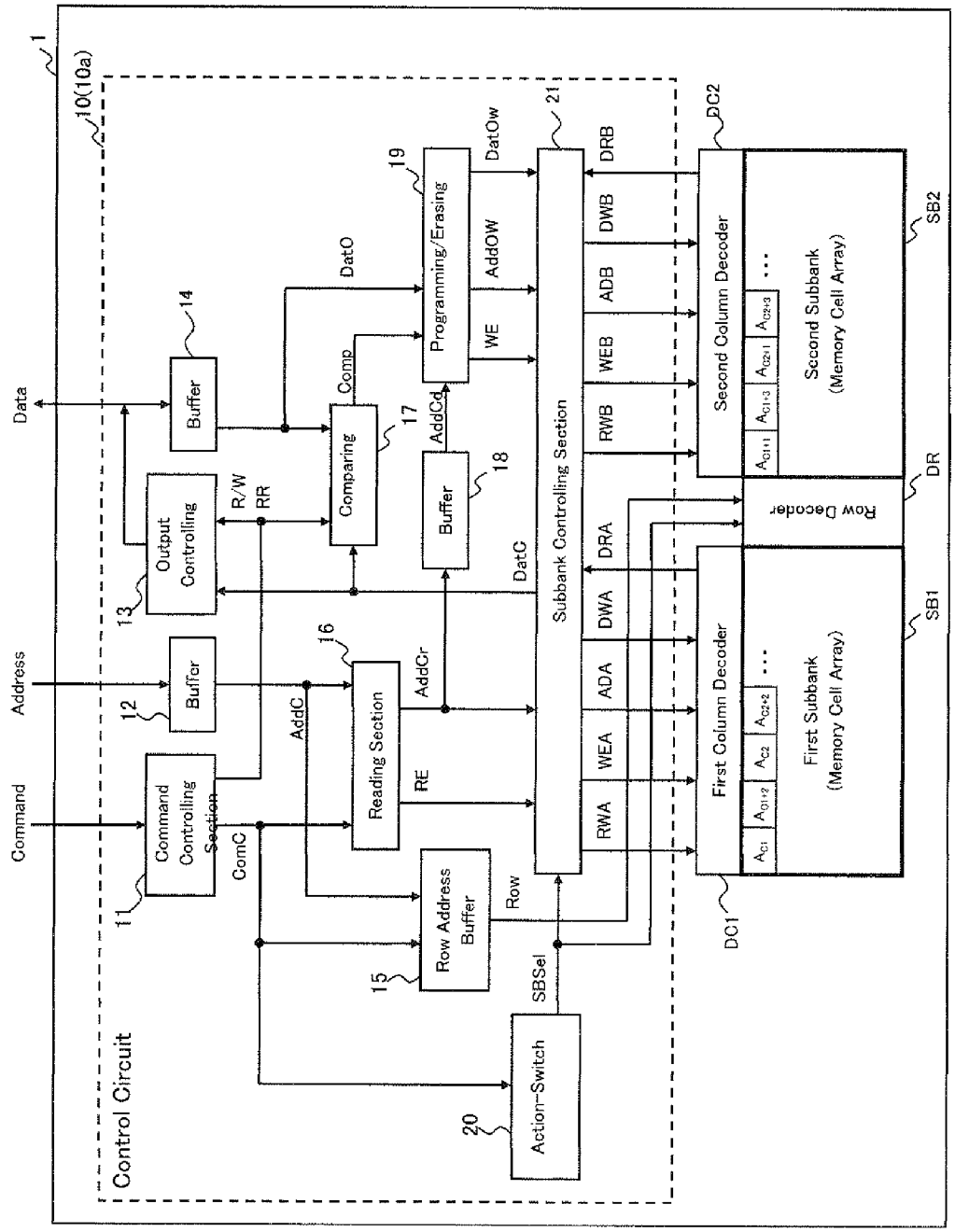
FIG. 1 is a diagram showing a configurational example of a semiconductor memory device of the present invention.

A schematic circuit configuration of a semiconductor memory device of an embodiment according to the present invention (hereinbelow referred to as "the device 1 of the present invention" when appropriate) is shown in FIG. 1. As shown in FIG. 1, the device 1 of the present invention is configured by including a memory cell array configured by including two subbanks, namely a first subbank SB1 and a second subbank SB2, a control circuit 10 (10a) that performs control of respective actions including a programming action, an erasing action and a second programming action, a row decoder DR that applies a voltage to word lines WL1 to WLm of the first subbank SB1 and the second subbank SB2 based on a command from the control circuit 10 (10a), a first column decoder DC1 that applies a voltage to bit lines BL11~BL1n of the first subbank SB1 based on a command from the control circuit 10 (10a), and a second column decoder DC2 that applies a voltage to bit lines BL21 to BL2n of the second subbank SB2 based on a command from the control circuit 10 (10a). Further, the device 1 of the present invention in the present embodiment has a burst function that sequentially performs a plurality of programming orders.

Figure 2:
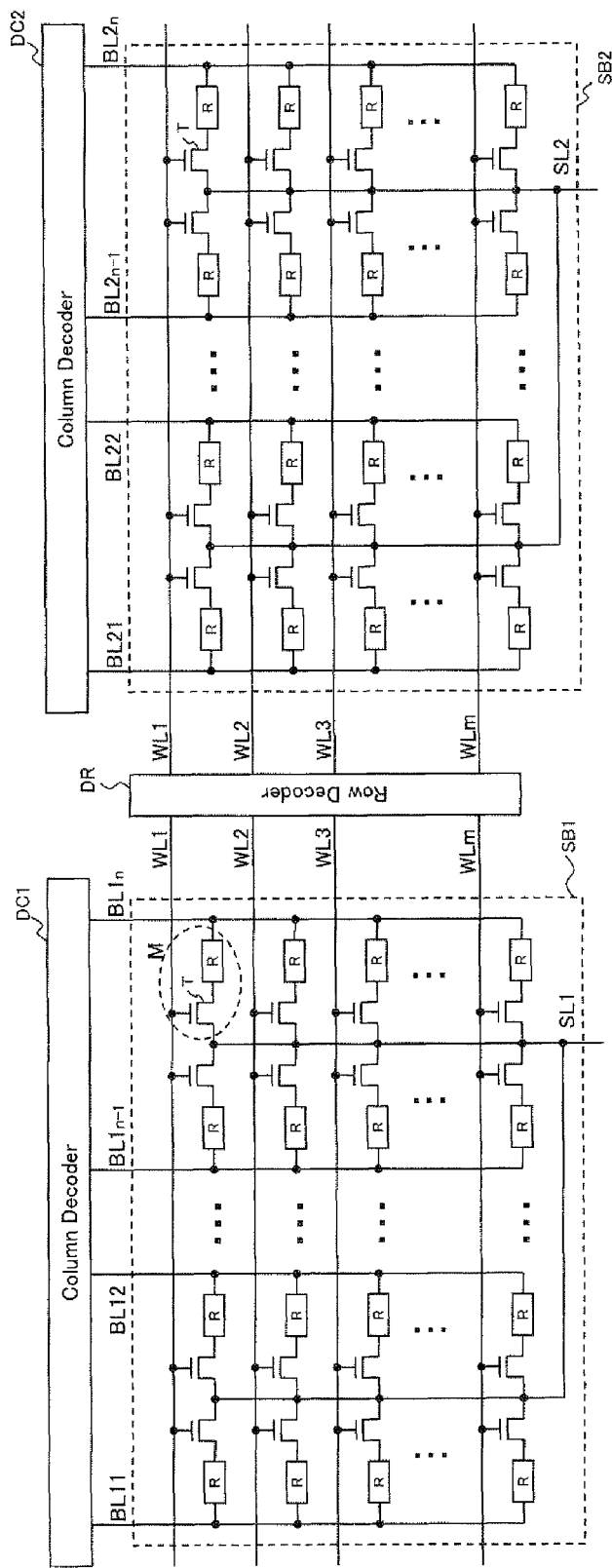
FIG. 2 is a diagram showing a configurational example of a memory cell array of the present invention.

A configurational example of the memory cell array of the device 1 of the present invention is shown in FIG. 2. As shown in FIG. 2, the memory cell array of the device 1 of the present invention is configured by being divided in a row direction into two sub banks, which are the first subbank SB1 and the second subbank SB2 that share word lines. Note that "the first subbank SB1 and the second subbank SB2 share word lines" means the relationship between the corresponding two word lines in the first subbank SB1 and the second subbank SB2 in which, in a case where they are electrically connected to each other, for example, when a voltage is applied to one of the word lines, the same voltage is applied to the other of the word lines.

As shown in FIG. 2, the first subbank SB1 of the memory cell array is configured by including a plurality of memory cells M, each of which includes one transistor T and one variable resistance element R. In each of the memory cell M, one terminal of a source or a drain of the transistor T and one terminal of the variable resistance element R are connected with each other. In the first subbank SB1, the m×n pieces of memory cells M are arranged in a matrix in the row direction (lateral direction of FIG. 2) and a column direction (vertical direction of FIG. 2), and in the respective memory cells M, the other terminals of the variable resistance elements of the memory cells arranged in the same column are respectively connected to a bit line BL1$j$ ($j$=1 to n) extending in the column direction, the other terminals of the sources or the drains of the transistors of the memory cells arranged in the same column are connected to a source line SL1 that is common for all of the memory cells, and a word line WL1$i$ (=1 to m) extending in the row direction is connected to gates of the transistors of the memory cells arranged in the same row. As for the source line SL1, all source lines within the memory cell array may be in common, or source lines may extend separately in a row or column direction, and the configuration thereof is not particularly limited. In the present embodiment, the first subbank SB1 is configured to switch a memory cell M to be selected/unselected by an application of gate voltage to the gate of the transistor T, and switch the action (programming action, reading action, or erasing action) on the memory cell M by a voltage-applying state of the one terminal of the variable resistance element R.

As shown in FIG. 2, similar to the first subbank SB1, the second subbank SB2 of the memory cell array has a plurality of the m×n pieces of memory cells M arranged in a matrix in the row direction and the column direction, and in the respective memory cells M, the other terminals of the variable resistance elements of the memory cells arranged in the same column are respectively connected to a bit line BL2$j$ (=1 to n) extending in the column direction, the other terminals of the sources or the drains of the transistors of the memory cells arranged in the same column are connected to a source line SL2 that is common for all of the memory cells, and a word line WL2$i$ (i=1 to m) extending in the row direction is connected to the gates of the transistors of the memory cells arranged in the same row. As for the source line SL2, all source lines within the memory cell array may be in common, or source lines may extend separately in the row or column direction, and the configuration thereof is not particularly limited. Similar to the first subbank SB1, the second subbank SB2 is configured to switch a memory cell M to be selected/unselected by the application of gate voltage to the gate of the transistor T, and switch the action (programming action, reading action, or erasing action) on the memory cell M by a voltage-applying state of the one terminal of the variable resistance element R.

Note that, in FIG. 2, since a voltage is simultaneously applied to the corresponding two word lines in the first subbank SB1 and the second subbank SB2, the corresponding word lines in the first subbank SB1 and the second subbank SB2 are denoted by WL$i$ instead of WL1$i$ and WL2$i$.

In the present embodiment, even number addresses are allotted to the first subbank SB1 (Ac$_{C1}$, A$_{C1+2}$, A$_{C2}$, A$_{C2+2}$), and odd number addresses are allotted to the second subbank SB2 A$_{C1+1}$, A$_{C1+3}$, A$_{C2+3}$). Note that the allotting of the addresses is not limited to this, and it may be configured to alternately allot addresses for every predetermined number, such as alternately allotting addresses for every two addresses (allotting A$_{C1}$, A$_{C1+1}$ to the first subbank SB1 and A$_{C1+2}$, A$_{C1+3}$ to the second subbank SB2).

Note that the first subbank SB1 and the second subbank SB2 of the device 1 of the present invention is not limited to the equivalent circuit shown in FIG. 2; the present invention is not limited as to the circuit configuration so long as the memory cells having the variable resistance elements and the current controlling elements are connected using the bit lines and the word lines to configure the memory cell array. Further, in the present embodiment, although the one terminal of the variable resistance element not connecting with the transistor is connected to the bit line, the one terminal of the variable resistance element not connecting with the transistor may be connected to the source line.

As a material for a variable resistor used as a metal oxide variable resistance element, in addition to Hf oxide, e.g., Hf oxynitride, or respective metal oxides or oxynitrides of Al, Ni, Co, Ta, Zr, W, Ti, Cu, V, Zn and Nb may be exemplified.

Further, as materials for electrodes to support the metal oxide, one of the electrodes can be materialized as a first electrode by using those with a large work function (e.g., TiN, Pt, Ir, etc.), and the other of the electrodes can be materialized as a second electrode by using those with the work function that is about the same level as the Fermi level of the metal oxide (e.g., Ta, Al, etc.). At this time, interfaces of the electrodes and the metal oxide come to be in an ohmic contact on a second electrode side, and a non-ohmic contact (Schottky barrier junction) on a first electrode side. When the programming action is to be performed, a positive bias is applied from the first electrode side, and when the erasing action is to be performed, the positive bias is applied from the second electrode side.

Here, with respect to the resistance state of the variable resistance elements, an action of writing the high resistance state to the low resistance state (erased state) is referred to as the erasing action, and an action of writing the low resistance state to the high resistance state (programmed state) is referred to as the programming action. Further, the erasing action and the programming action are collectively referred to as a writing action.

As for the metal oxide variable resistance element, the resistance state of the variable resistance element after the programming or erasing action transitions between two or more resistance states by controlling the voltage or current applied to the variable resistance element when the programming or erasing action is performed; whereas different information can be assigned to the respective resistance states by the variable resistance element having the low resistance state (erased state) with the lowest resistance and one or more resistance states (programmed state) with larger resistance value than the low resistance state; and information with two or more values can respectively be stored for the variable resistance element in each memory cell. Especially, by using variable resistance element having a plurality of programmed states and capable of storing three or more values, it becomes possible to store multivalued information.

At this time, the writing of the resistance state of the variable resistance element can be performed by controlling the application voltage or current, and since there is no need to adjust the number of times and duration of application of the voltage pulse applied to the variable resistance element each time different information is stored, a complicated algorithm is not necessary.

A specific configurational example of the control circuit 10 is shown in the control circuit 10a of FIG. 1. The control circuit 10a is configured by including a command controlling section 11 that controls the respective circuit sections by receiving a command inputted from outside, a buffer 12 that stores address signals inputted from outside, an output controlling section 13 that controls outputs of output data outputted from the first subbank SB1 or the second subbank SB2, a buffer 14 that stores the output data and external input data that is inputted from outside, a row address buffer 15 that stores row addresses in the address signals stored in the buffer 12, a reading section 16 that performs control of the reading action, a comparing section 17 that compares the output data and programmed data (anticipated value of the external input data), a buffer 18 that stores an address signal AddCr from the reading section 16, a programming/erasing section 19 that performs control of the programming action, the program verifying action and the erasing action, an action-switch controlling section 20 and a subbank controlling section 21.

In a case where a signal Comp outputted from the comparing section 17 indicates that a programming action did not complete normally, the programming/erasing section 19 accumulates addresses of program target cells M in which the programming action did not complete normally and programmed data for each subbank, and outputs a signal WE indicating that the programming action was not performed normally, a signal AddOW indicating the address of the program target cell M and a signal DAtOw indicating the programmed data to the subbank controlling section 21.

The subbank controlling section 21 is configured to output to the first column decoder DC1 of the first subbank SB1 a signal RWA indicating which one of the programming action, the erasing action and the reading action is the action to be performed, a signal WEA indicating which bit in the data the programming action or the erasing action should be performed on in the case where the signal RWA indicates either the programming action or the erasing action, a signal ADA indicating a column address, and a signal DWA indicating program data and receive a signal DRA indicating read data from the first column decoder DC1.

Similarly, the subbank controlling section 21 is configured to output to the second column decoder DC2 of the second subbank SB2 a signal RWB indicating which one of the programming action, the erasing action and the reading action is the action to be performed, a signal WEB indicating which bit in the data the programming action or the erasing action should be performed on in the case where the signal RWB indicates either the programming action or the erasing action, a signal ADB indicating a column address, and a signal DWB indicating program data and receive a signal DRB indicating read data from the second column decoder DC2.

Further, the reading section 16 serves a role as a verification section for verifying whether or not the resistance properties of the variable resistance elements in the memory cells that are the programming target are within the desired resistance distribution range in the programming action.

Next, the writing action on the memory cells in the present embodiment will be described. Note that, in the present embodiment, a description will be given in detail of a variable resistance element having two resistance states of the low resistance state and the high resistance state and a binary bipolar operation property of transitioning between the respective resistance states by the application of voltage pulses with different polarity.

Figure 3:
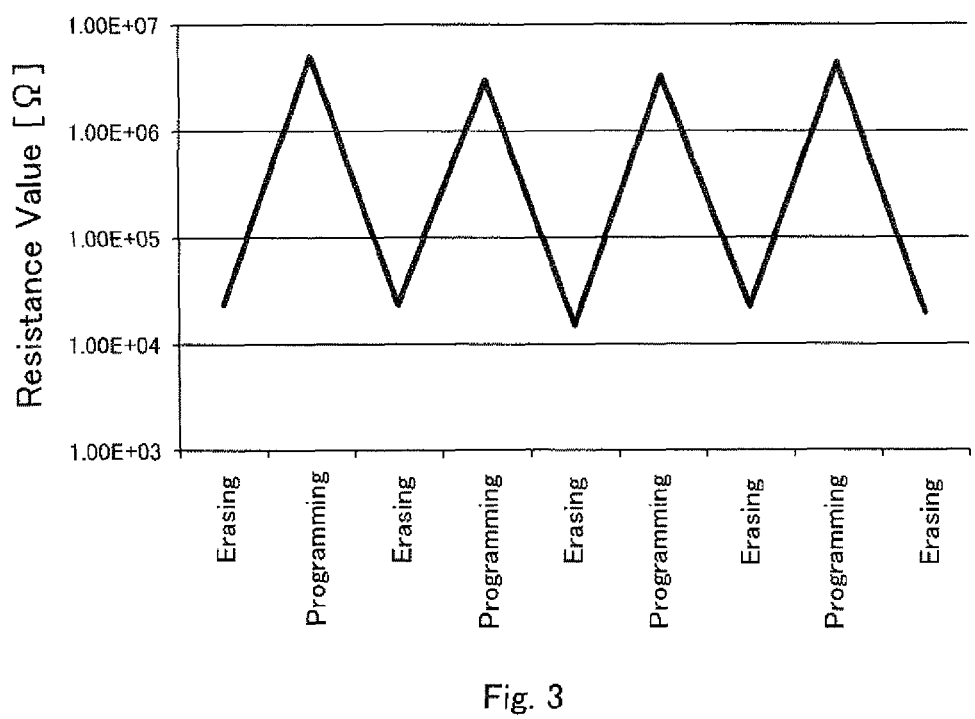
FIG. 3 is a diagram showing a switching property of variable resistance elements used in a verification of an effect of the present invention.

FIG. 3 shows a transition of a resistance value of a variable resistance element R in which hafnium oxide (HfOx) of 3 nm is deposited on titanium nitride (TiN) as the lower electrode configuring one terminal of the variable resistance element, and tantalum (Ta) as the upper electrode that is to be the other terminal of the variable resistance element is stacked thereon, when the erasing action and the programming action are alternately repeated.

As shown in FIG. 3, when a voltage pulse of 1.6 V, 50 nsec is applied to the lower electrode as the programming voltage pulse with an upper electrode side as a reference, e.g., the variable resistance element R transitions to the programmed state with high resistance (resistance value: 5 M$\Omega$), and when a voltage pulse of 1.8 V, 50 nsec is applied to the upper electrode as the erasing voltage pulse with the lower electrode side as the reference, e.g., the variable resistance element R transitions to the erased state with low resistance (resistance value: 20 k$\Omega$). Note that the reading of the resistance value is performed by applying voltage of 0.5 V between the electrodes. Accordingly, in the case of alternately applying the erasing voltage pulse and the programming voltage pulse, the variable resistance element transitions from one to another between the erased state (low resistance state) and the programmed state (high resistance state) by the application of the respective voltage pulses, and exhibits a favorable switching property.

Figure 4:
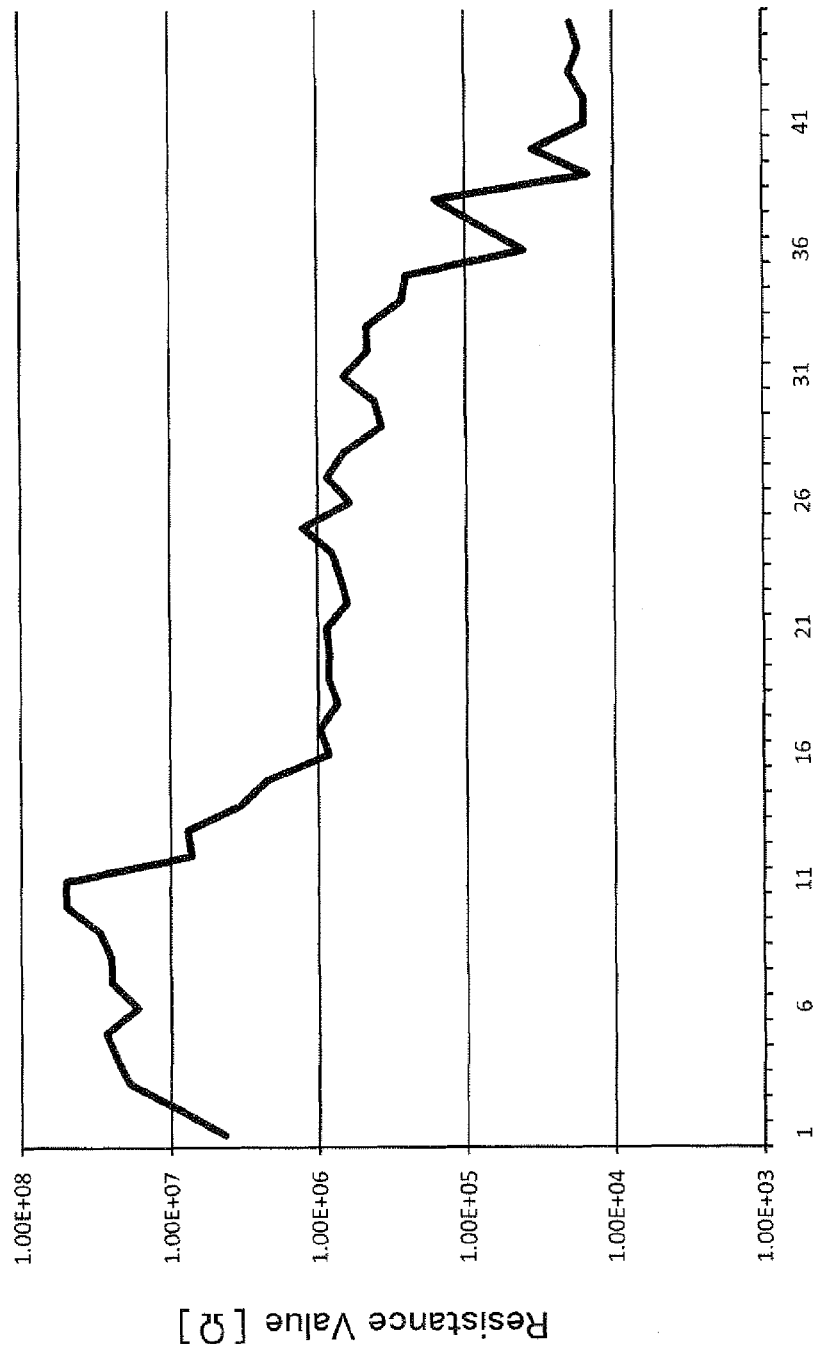
FIG. 4 is a diagram showing a program overwriting durability of the variable resistance elements used in the verification of the effect of the present invention.

Meanwhile, FIG. 4 shows the transition of the resistance value of the variable resistance element R in the case of further applying the programming voltage pulse sequentially in the high resistance programmed state as a result of the program overwriting. As shown in FIG. 4, since the resistance value of the variable resistance element R after the programming action gradually decreases by repeating the program overwriting, when the programming action is performed sequentially for more than forty times, it becomes difficult to distinctively read the programmed state and the low resistance erased state.

Figure 5:
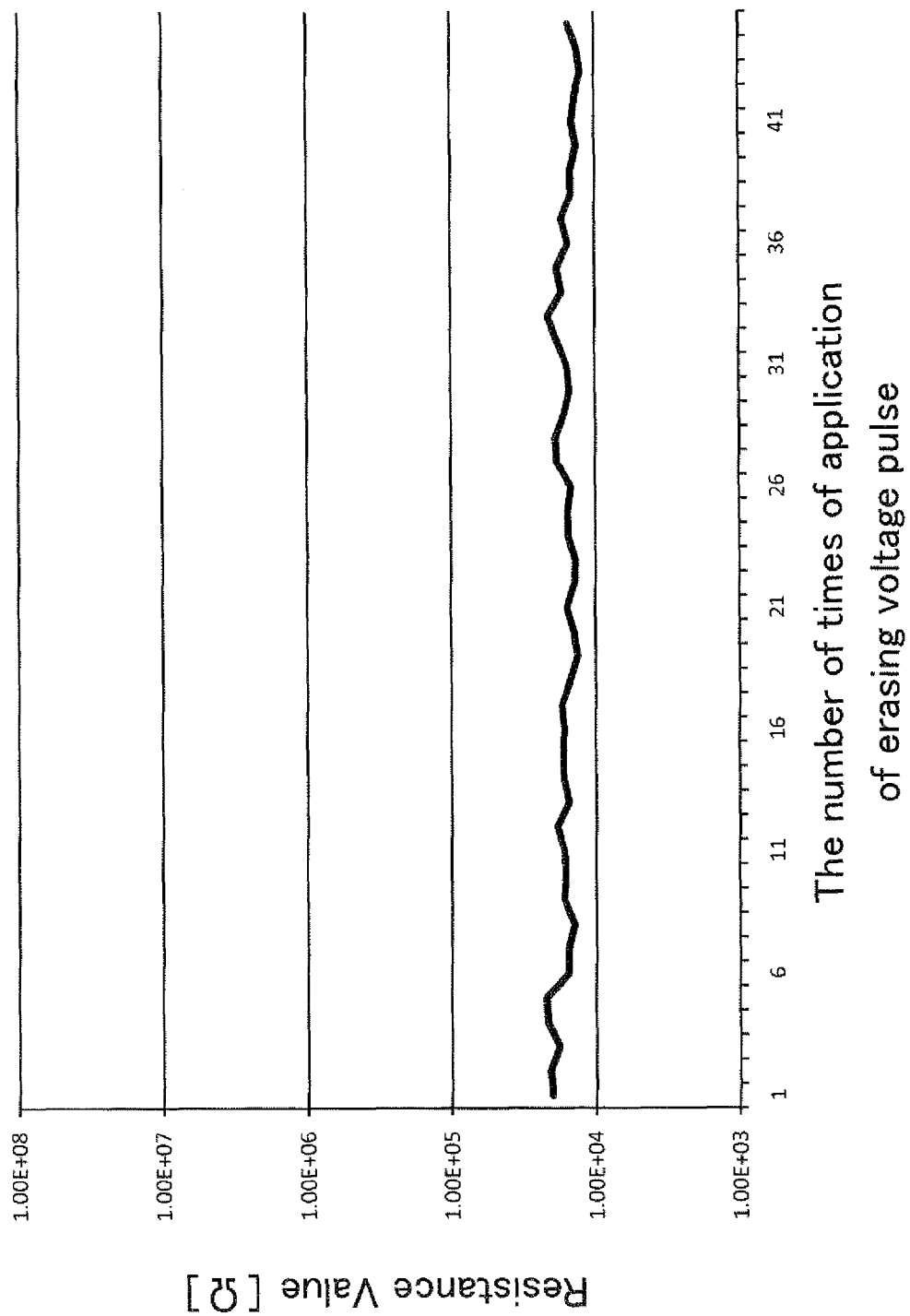
FIG. 5 is a diagram showing an erasure overwriting durability of the variable resistance elements used in the verification of the effect of the present invention.

On the other hand, FIG. 5 shows the transition of the resistance value of the variable resistance element R in the case of further applying the erasing voltage pulse sequentially in the low resistance erased state as a result of the erasure overwriting. As shown in FIG. 5, it can be seen that even when the erasure overwriting is repeated, the resistance value of the variable resistance element R after the erasing action maintains substantially a constant value without fluctuation thereof. That is, it can be said that the variable resistance element R has durability against the erasure overwriting.

Figure 6:
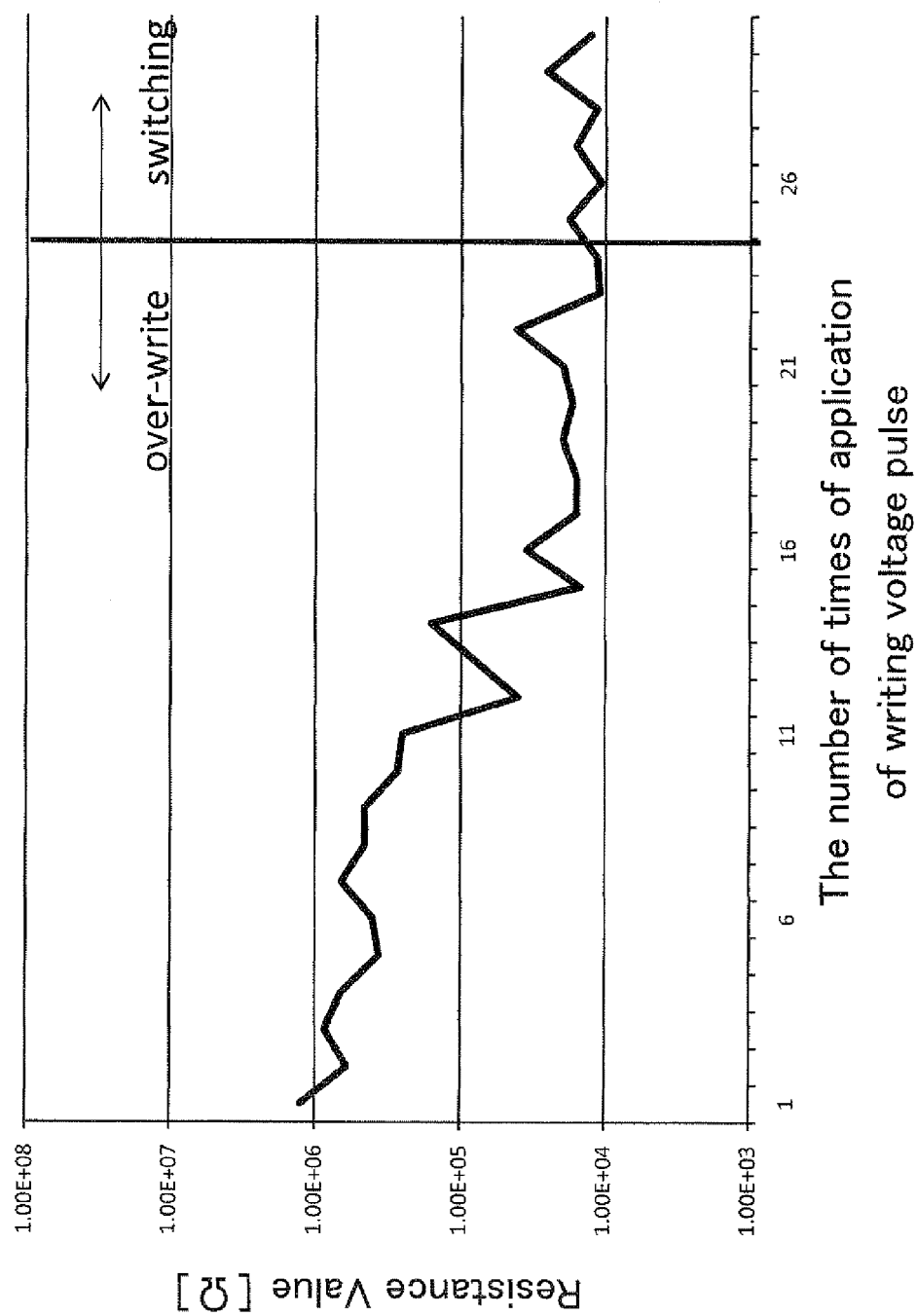
FIG. 6 is a diagram showing the switching property of the variable resistance elements used in the verification of the effect of the present invention, in a case where after a programming voltage pulse is sequentially applied for plural times, an erasing voltage pulse and the programming voltage pulse are alternately applied for plural times.

Further, FIG. 6 shows the transition of the resistance value of the variable resistance element R in the case of alternately applying the erasing voltage pulse and the programming voltage pulse after having applied the programming voltage pulse sequentially to the variable resistance element R in the programmed state thereby continuing to perform the program overwriting. As shown in FIG. 6, when the programming action is further performed sequentially on the variable resistance element in the programmed state, the resistance value gradually decreases, the resistance value that is supposed to be a high resistance in a normal condition does not increase efficiently even when the erasing action and the programming action are alternately performed thereafter, and thus a normal writing action cannot be performed.

Figure 7:
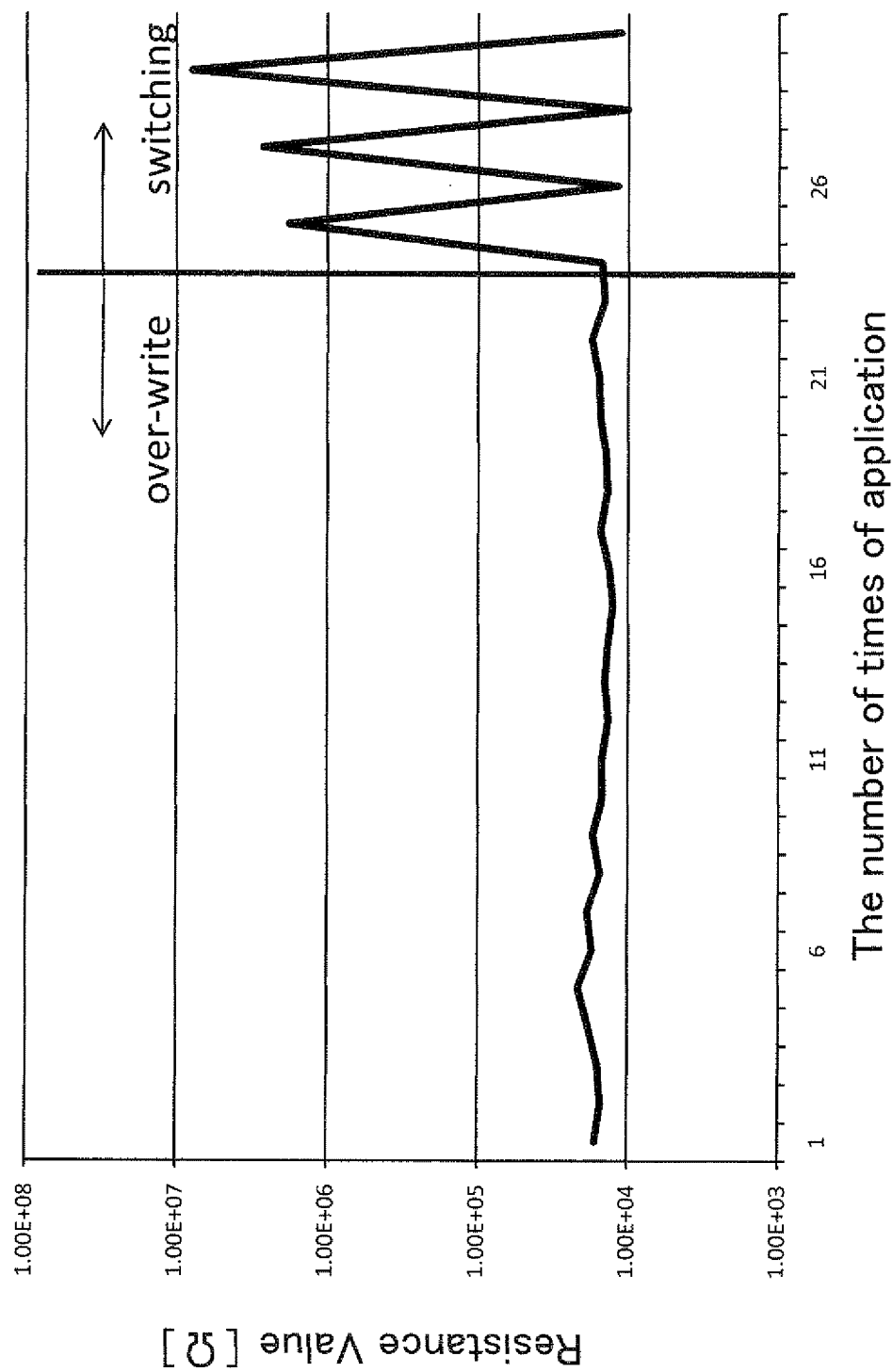
FIG. 7 is a diagram showing the switching property of the variable resistance elements used in the verification of the effect of the present invention, in a case where after the erasing voltage pulse is sequentially applied for plural times, the programming voltage pulse and the erasing voltage pulse are alternately applied for plural times.

On the other hand, FIG. 7 shows the transition of the resistance value of the variable resistance element R in the case of alternately applying the programming voltage pulse and the erasing voltage pulse after having applied the erasing voltage pulse sequentially to the variable resistance element R in the erased state thereby continuing to perform the erasure overwriting. As shown in FIG. 7, even when the erasing action is further performed sequentially on the variable resistance element in the erased state thereby continuing to perform the erasure overwriting, a normal writing action can be performed in the writing action thereafter.

Figure 8:
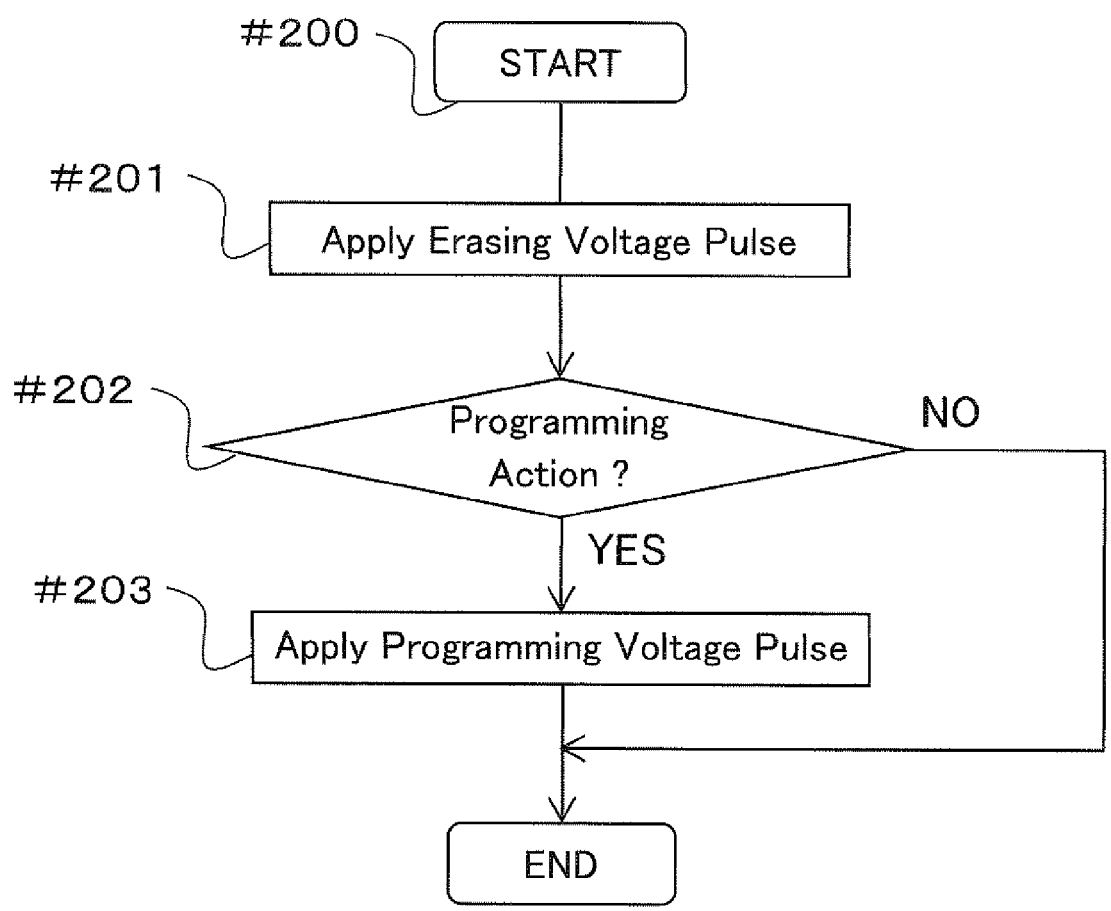
FIG. 8 is a flowchart showing a method of a writing action of the present invention.

Thus, upon performing the writing action (programming action and erasing action) of the variable resistance element R, the problems of the decrease in the resistance value due to the program overwriting or the writing action failure can be avoided by causing operations as below. FIG. 8 shows a flowchart of the writing action according to the present invention.

(1) When the writing action is to be performed, whether the resistance state of the writing target variable resistance element just before performing the writing action is in the programmed state or the erased state, regardless of the resistance state of the variable resistance element, the erasing voltage pulse is once applied to cause it to transition to the erased state (step #201).

(2) Thereafter, in the case with the programming action (YES in the divergence of step #202), the programming voltage pulse (first programming voltage pulse) is applied to cause the resistance state of the programming target variable resistance element to transition from the erased state to the programmed state (step #203).

At this time, in step #201, upon applying the erasing voltage pulse, the erasing voltage pulse may be applied collectively to all of the writing target variable resistance elements, or the erasing voltage pulse may be applied independently by sequentially selecting a writing target variable resistance element. Alternatively, the erasing voltage pulse may be applied collectively by selecting the writing target variable resistance elements for every word line or bit line.

Due to this, upon performing the erasing action by selecting memory cells in the array in random order, if the erasing target variable resistance element is in the programmed state, the programmed state is brought to the erased state by the application of the erasing voltage pulse, so that the erasing action is normally performed. On the other hand, if the erasing target variable resistance element is in the erased state, the erased state is brought to the erased state by the application of the erasing voltage pulse and the erasure overwriting occurs, however, as described in FIG. 5, since the resistance value hardly changes even when the erasure overwriting is repeated, the erased state can be maintained. Further, as described in FIG. 7, the writing action can be performed normally in the writing actions thereafter.

On the other hand, upon performing the programming action by selecting the memory cell in the array in random order, if the programming target variable resistance element is in the programmed state, the programmed state is brought to the erased state and further brought to the programmed state by applying the programming voltage pulse after having applied the erasing voltage pulse, and the program overwriting does not occur, thus the resistance state of the programming target variable resistance element is maintained in the programmed state. Further, if the programming target variable resistance element is in the erased state, although the erased state is brought to the erased state and further to the programmed state by applying the programming voltage pulse after having once applied the erasing voltage pulse, the resistance value hardly changes even when the erasure overwriting is repeated, and the programming can be performed normally by the application of the programming voltage pulse thereafter, so that the programming is performed normally.

That is, when the programming action is to be performed, by applying the programming voltage pulse after having once applied the erasing voltage pulse regardless of the resistance state of the variable resistance element, the overwriting occurs only in the erasure overwriting even if the writing voltage pulse is applied sequentially, and data is retained without any occurrence of abnormal deterioration of the resistance value.

Figure 9:
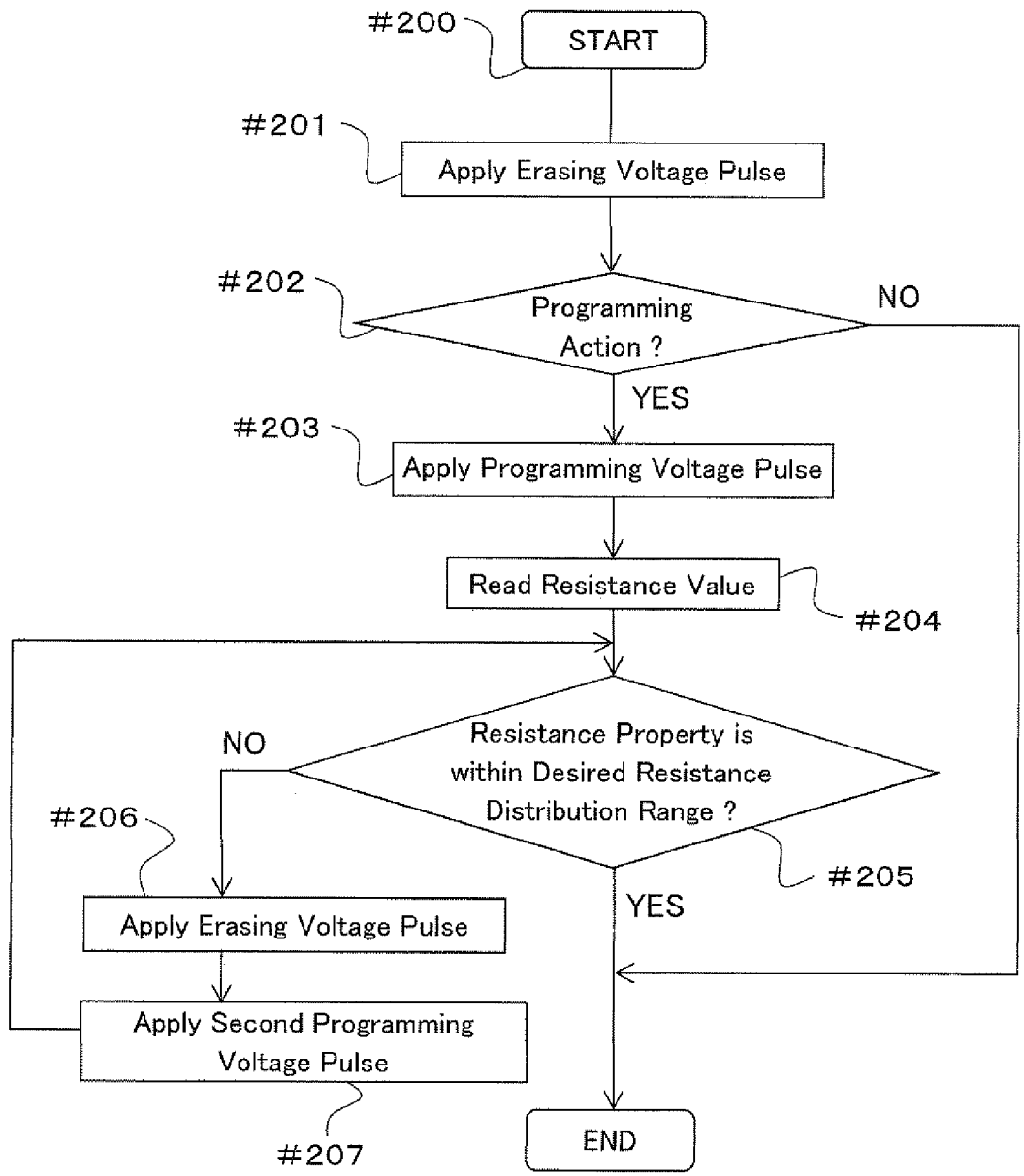
FIG. 9 is a flowchart showing a method of the writing action of the present invention that is combined with a program verifying action.

Further, FIG. 9 shows a flowchart of the writing action in the case of performing the program verifying action that verifies whether or not the resistance property after the program of the variable resistance element is within a desired resistance distribution range after the application of the programming voltage pulse. In FIG. 9, in a case where it is determined that in the program verifying action, the resistance property after the program is not within the desired resistance distribution range, the programming is controlled by applying the erasing voltage pulse and the second programming voltage pulse again so that the resistance property is brought to be within the desired resistance distribution range while avoiding a program overwriting.

Hereinbelow, the writing action accompanying the program verifying action of the present embodiment will be explained with reference to the flowchart of FIG. 9.

Firstly, similar to the erasing action and the programming action, the erasing voltage pulse is applied to the writing target variable resistance element regardless of the resistance state of the variable resistance element (step #201), and thereafter, the programming voltage pulse is applied to the programming target variable resistance element (step #203). At this time, in a case where there is a plurality of writing target variable resistance elements, the erasing voltage pulse may be applied collectively by selecting all of the writing target variable resistance elements, and the erasing voltage pulse may be applied independently by sequentially selecting a writing target variable resistance element. Alternatively, the erasing voltage pulse may be applied collectively by selecting the writing target variable resistance elements for every word line or bit line.

Thereafter, the resistance values of all of the programming target variable resistance elements are read (step #204), and a determination is made on whether or not the resistance properties in the programmed state are within the desired resistance distribution range (step #205). At this time, in the case of having a plurality of resistance states as the programmed state, the determination on whether or not the resistance property is within the desired resistance distribution range is made with a determination reference being whether the programmed state is a particular resistance value or more, or within a particular range from one resistance value to another resistance value.

In this determination, in a case where a programming target variable resistance element having its resistance property not within the desired resistance distribution range exists (diverting to NO in step #205), the programming is performed again, and the resistance property is controlled to be brought to be within the desired resistance distribution range.

At this time, when the programming voltage pulse is applied again to the variable resistance element in the programmed state, since the variable resistance element is program overwritten, the programmed state is not normal, and there is a possibility that the programming failure may occur. Due to this, the erasing voltage pulse is applied to the programming target variable resistance element that does not have the resistance property being within the desired resistance distribution range (step #206), and after having transitioned the variable resistance element to the erased state, the second programming voltage pulse is applied afresh (step #207).

Then, the application of the erasing voltage pulse and the application of the second programming voltage pulse are repeated until the resistance properties of all of the programming target variable resistance elements are brought to be within the desired resistance distribution range.

Figure 10:
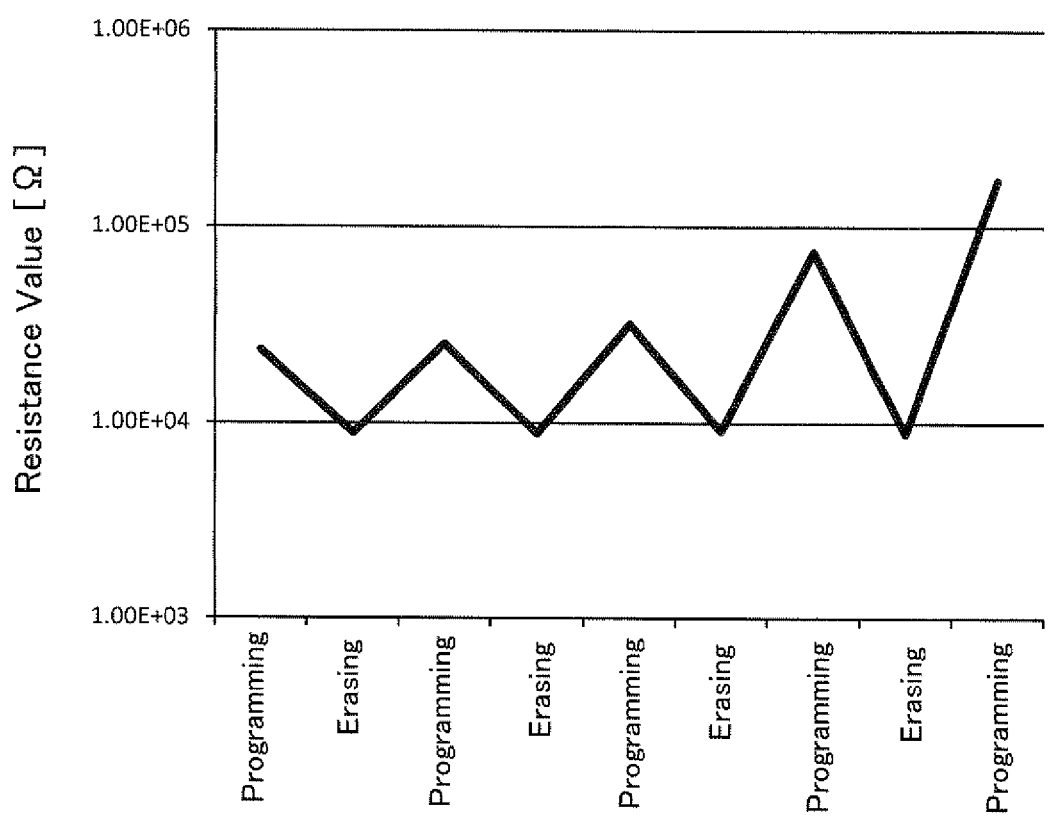
FIG. 10 is a diagram showing a change in a resistance value in a variable resistance element to which a programming could not have been performed by one application of the programming voltage pulse, when the erasing voltage pulse and a second programming voltage pulse are further applied alternately for plural times.

FIG. 10 shows the transition of the resistance value of a variable resistance element, in which the programming failure had occurred in the one-time application of the programming voltage pulse and that had not been able to transition to the programmed state, in the case of repeating the applications of the erasing voltage pulse and the second programming voltage pulse until the resistance property is brought to be within the desired resistance distribution range of the programmed state (which is herein 100 kΩ or more) by the above method. As shown in FIG. 10, even if the programmed state could not have been reached by one time of the programming action, by repeating the applications of the erasing voltage pulse and the second programming voltage pulse, the resistance value can be raised to the desired resistance distribution range.

Further, in the case of repeatedly applying the second programming voltage pulse to the programming target variable resistance element whose resistance property is not within the desired resistance distribution range after the application of the programming voltage pulse for the first time, it is preferable to set an absolute value of an application voltage of the second programming voltage pulse to be smaller than an absolute value of the application voltage of the programming voltage pulse in the first application, and thereafter increase the absolute value of the application voltage in steps each time the application of the second programming voltage pulse is repeated.

Figure 17:
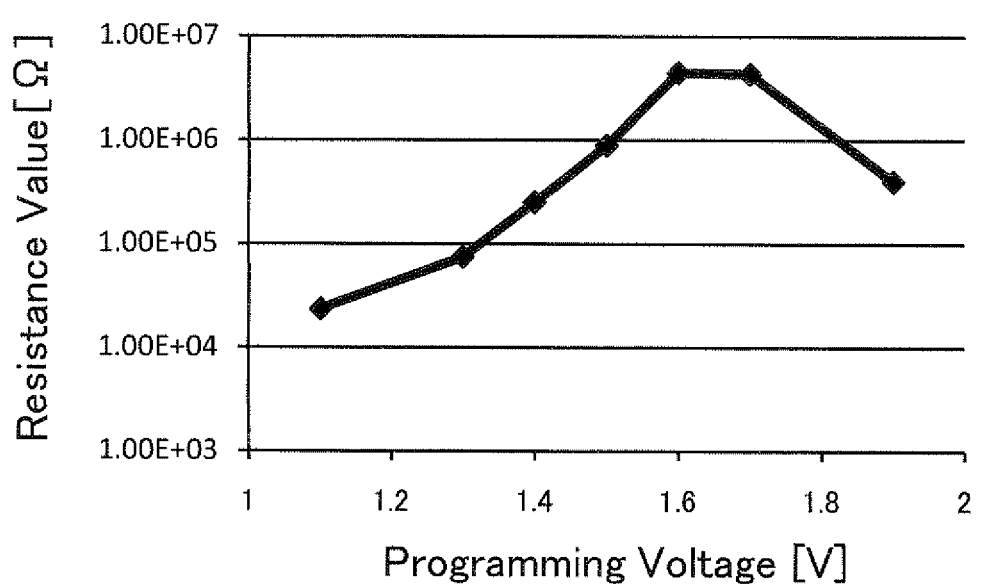
FIG. 17 is a resistance hysteresis curve showing a relationship of an absolute value of the writing voltage pulse applied to the variable resistance element and the resistance value after the application of the writing voltage pulse.

Due to having a resistance hysteresis curve as shown in FIG. 17 as a property of the variable resistance element, the resistance value after the programming changes greatly depending on the programming voltage applied to the variable resistance element, and for some variable resistance elements, a subtle difference in the application voltage gives rise to a great difference in the electric resistance. The resistance hysteresis curve of FIG. 17 has the variability for each element, and even if an identical programming voltage pulse is applied, since the difference in the voltage or current that is actually applied occurs for each element due to the position of the variable resistance element within the array, there is a possibility that a variable resistance element having the resistance property that is not brought to be within the desired resistance distribution range even by the application of the identical programming voltage pulse exists.

In such a case, even if the applications of the erasing voltage pulse and the programming voltage pulse are repeated, so long as all of the absolute values of the applied programming voltage pulses are identical, it is difficult to control the resistance property in the programmed state of the variable resistance element to be within the desired resistance distribution range.

However, the absolute value of the second programming voltage pulse that is repeatedly applied may be set smaller than the programming voltage pulse of the first time in the first time application of the second programming voltage pulse, and thereafter, by increasing the same in steps in the application of the second programming voltage pulse for the second and subsequent times, the programming can be controlled stably by taking the property variability of each element into consideration.

Figure 11:
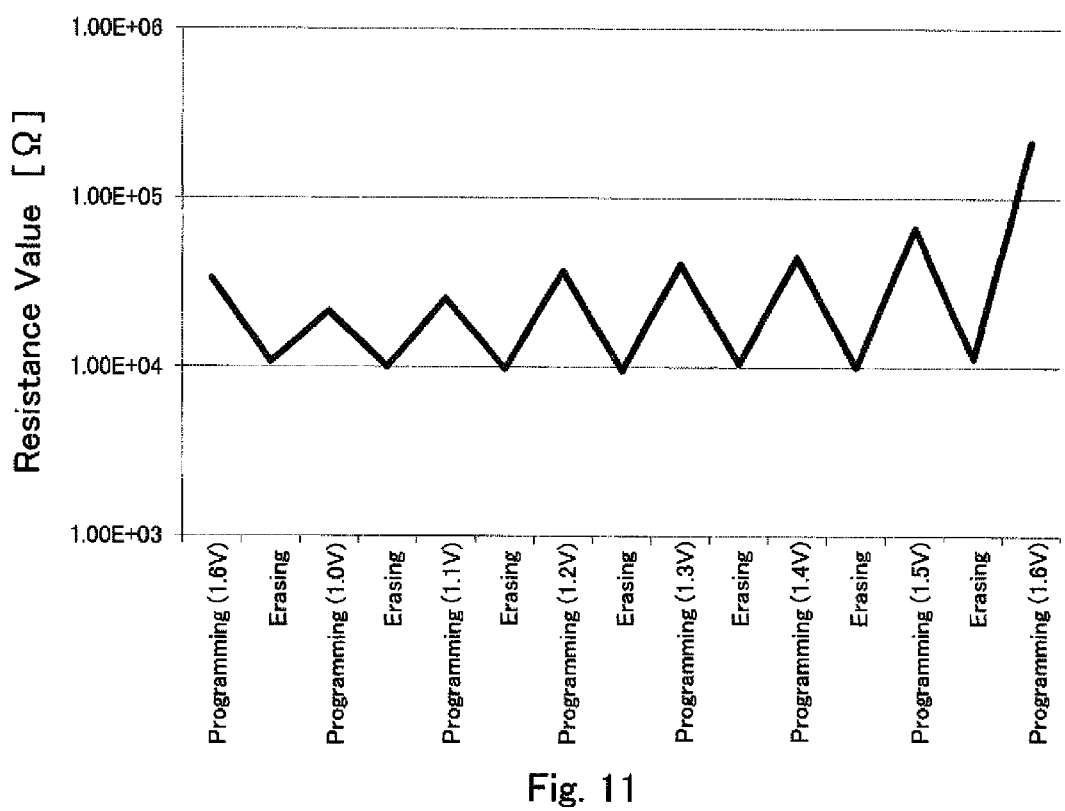
FIG. 11 is a diagram showing a change in the resistance value in the variable resistance element to which the programming could not have been performed by one application of the programming voltage pulse, when the erasing voltage pulse and the second programming voltage pulse are further applied alternately for plural times while increasing an application voltage of the second programming voltage pulse.

FIG. 11 shows the transition of the resistance value of a variable resistance element, in which the programming failure had occurred in the first-time application of the programming voltage pulse of 1.6 V and that had not been able to transition to the programmed state, in the case of repeating the applications of the erasing voltage pulse and the second programming voltage pulse while increasing the absolute value of the application voltage of the second programming voltage pulse in steps of 0.1 V from 1.0 V. As shown in FIG. 11, even if the programmed state could not have been reached by one time of the programming action, by repeating the applications of the erasing voltage pulse and the second programming voltage pulse while changing the application voltage of the second programming voltage pulse, the resistance value can surely be raised to the desired resistance distribution range (which is herein 100 kΩ or more).

Figure 12:
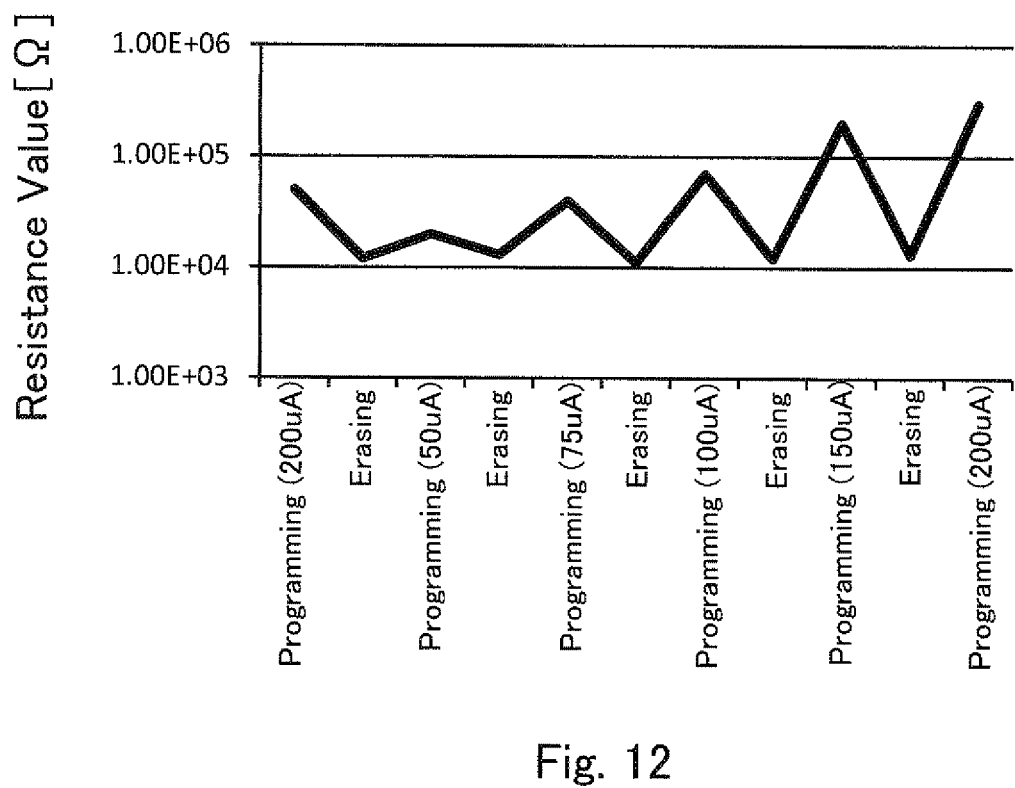
FIG. 12 is a diagram showing a change in the resistance value in the variable resistance element to which the programming could not have been performed by one application of the programming voltage pulse, when the erasing voltage pulse and the second programming voltage pulse are further applied alternately for plural times while increasing a programming current accompanying the pulse application.

Note that, although the programming is performed in FIG. 11 by increasing the application voltage of the second programming voltage pulse in steps, the programming is possible by increasing the application current in steps. FIG. 12 shows the transition of the resistance value of a variable resistance element, to which the programming voltage pulse had been applied under a state in which the programming current is limited to 200 µA but that could not have transitioned to the programmed state, in the case of repeating the applications of the erasing voltage pulse and the second programming voltage pulse while the programming current upon the application of the second programming voltage pulse is increased in steps from 50 µA. Note that, the values of the application voltage and application current as well as the resistance values of the second programming voltage pulses in FIG. 11 and FIG. 12 are mere examples for describing the present embodiment, and do not limit the property of the variable resistance elements.

In the above writing action, since the erasing voltage pulse is always applied once regardless of the resistance state of the writing target variable resistance element, time for applying the erasing voltage pulse is required in the case of the programming action. However, since the time required for the erasing action of the variable resistance element represented by the metal oxide variable resistance element is a few 10 nsec or less, which is short, the writing action can be performed in a sufficiently short period of time compared to a flash memory requiring a few µsec or more for the programming action and a few msec or more for the erasing action. Due to this, the device of the present invention is capable of performing the erasing action in a bit unit not in a byte unit or a block unit, and compared to the flash memory, it has a high performance not only in its high-speed operation but also the random accessibility.

Figure 13:
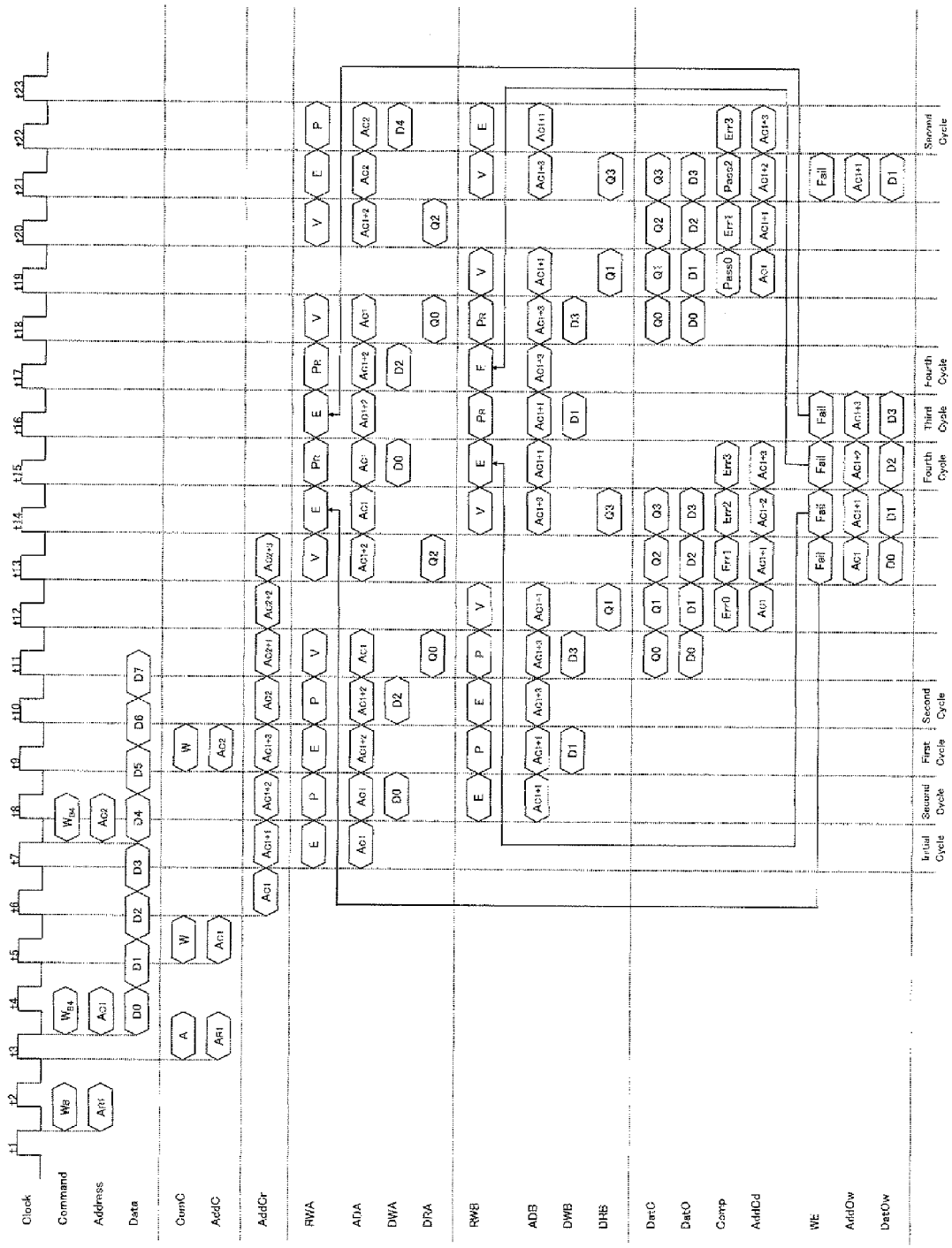
FIG. 13 is a timing chart showing an example of processes of the writing action in the semiconductor memory device of the present invention.
Figure 14:
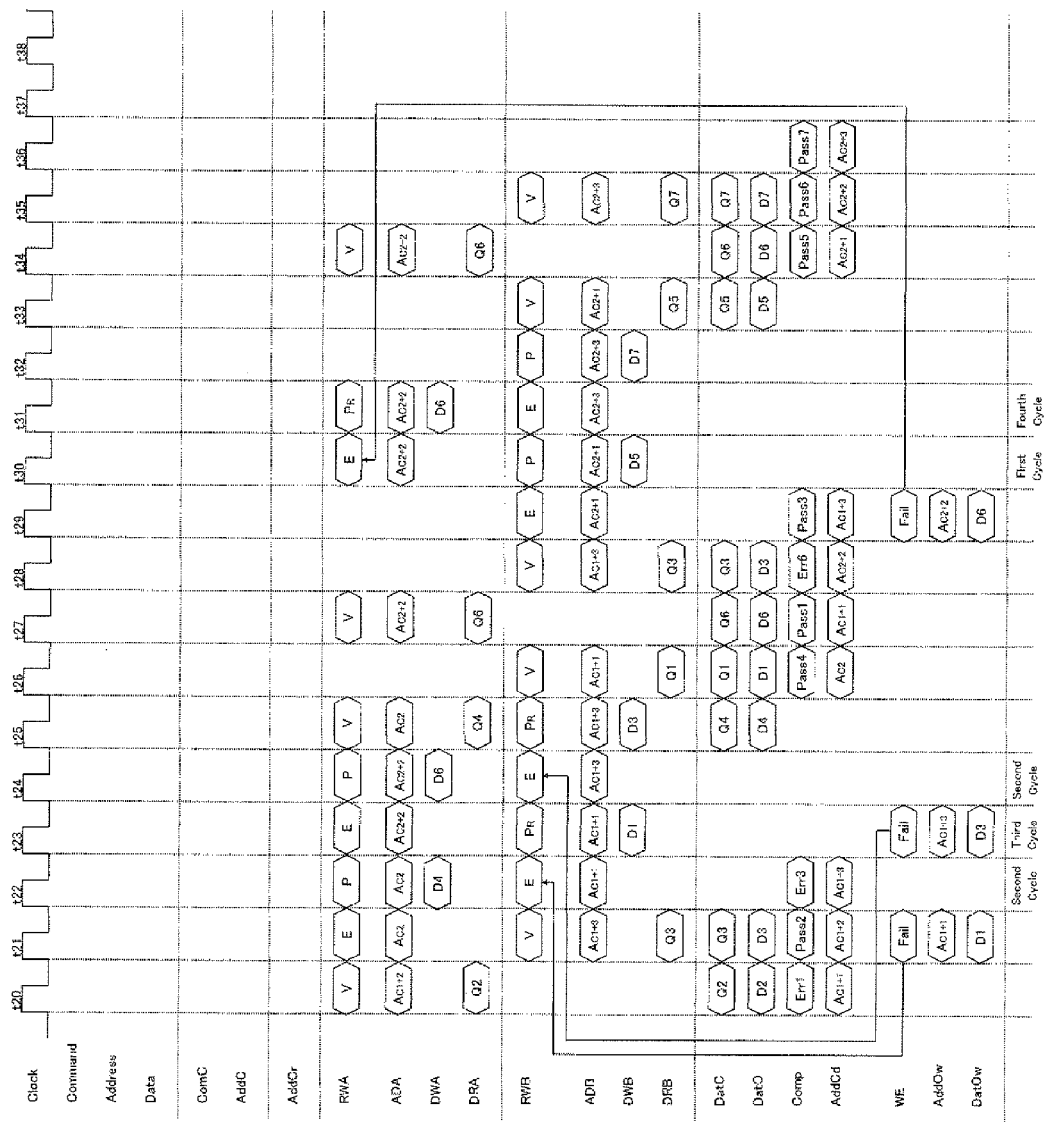
FIG. 14 is a timing chart showing the example of the processes of the writing action in the semiconductor memory device of the present invention.

Hereinbelow, processing operations of the device 1 of the present invention will be explained with reference to FIG. 9 as well as FIG. 13 and FIG. 14. FIG. 13 and FIG. 14 are a timing chart for the case of performing the aforementioned writing action in the device 1 of the present invention. FIG. 13 shows a period from clock cycles t1 to t23, and FIG. 14 shows a period from clock cycles t20 to t38. Note that, the clock cycles t1 to t38 are respectively started at a raising timing of each clock, and a triggering time of each clock cycle ti (i=1 to 38) is referred to as time ti.

Note that, the device 1 of the present invention in the present embodiment is configured so as to be capable of alternately performing a first action cycle of applying the erasing voltage pulse to a memory cell in the first subbank SB1 that is the target of the erasing action or the programming action and applying the first programming voltage pulse to a memory cell in the second subbank SB2 that is the target of the programming action, and a second action cycle of applying the first programming voltage pulse to a memory cell in the first subbank SB1 that is the target of the programming action and applying the erasing voltage pulse to a memory cell in the second subbank SB2 that is the target of the erasing action or the programming action. Further, the device 1 of the present invention in the present embodiment is configured so as to be capable of alternately performing a third action cycle of applying the erasing voltage pulse to the memory cell in the first subbank SB1 that is the target of the erasing action, the programming action, or the second programming action and applying the second programming voltage pulse to the memory cell in the second subbank SB2 that is the target of the second programming action, and a fourth action cycle of applying the second programming voltage pulse to the memory cell in the first subbank SB1 that is the target of the second programming action and applying the erasing voltage pulse to the memory cell in the second subbank SB2 that is the target of the erasing action, the programming action, or the second programming action.

Further, FIG. 13 shows a case in which programming commands $W_{B4}$ (having a burst length of 4), by which four pieces of programmed data are sequentially programmed by the burst function, are inputted. Further, in the present embodiment, for the sake of explanation, a case in which the programmed data has a 1-bit configuration will be explained. More specifically, FIG. 13 shows a case in which a programming commands $W_{B4}$ for programming write data D0, D2, D4, and D6 to memory cells M in the first subbank SB1 indicated by the row address $A_{R1}$ and the write address (column address) $A_{C1}$, and a programming commands $W_{B4}$ for programming write data D1, D3, D5, and D7 to memory cells M in the second subbank SB2 indicated by the row address $A_{R1}$ and the write address $A_{C2}$ are sequentially inputted by the burst function. Note that, as the column addresses of the write data D0, D2, D4, and D6, $A_{C1}$, $A_{C1+2}$, $A_{C2}$, and $A_{C2+2}$ are set automatically by the burst function, and as the column addresses of the write data D1, D3, D5, and D7, $A_{C1+1}$, $A_{C1+3}$, $A_{C2+1}$, and $A_{C2+3}$ are set automatically by the burst function. Further, in FIG. 13, the write data D0 to D7 are successively inputted to the buffer 14 so that they do not change at the triggering timing of each clock signal by being in synchronization with the clock signal.

Further, in the present embodiment, in the aforementioned writing action, although a case in which the writing action is performed based on the external clock signals provided from the outside is assumed, it may be configured such that the controlling circuit 10 generates the clock signals for the writing action after the input of an initial programming command.

Note that, in the present embodiment, for the sake of explanation, a case in which the programming voltage pulse is applied to memory cells designated by all of the row addresses $A_{R1}$ and the column addresses $A_{C1}$, to $A_{C1+3}$ and $A_{C2}$ to $A_{C2+3}$, to program to a programmed state of "0" will be explained. That is, a case where the external input data D0 to D7 are "00000000" will be explained as an example.

In FIG. 13 and FIG. 14, for the signal RWA and the signal RWB, "E" indicates a step of applying the erasing voltage pulse, "P" indicates a step of applying the first programming voltage pulse, "V" indicates a program verifying step after the application of the programming voltage pulse and "$P_R$" indicates a step of applying the second programming voltage pulse in a case where the program verification result is "Fail", respectively.

The device 1 of the present invention in the present embodiment starts the writing action (time t2, step #200) when the programming command $W_B$ by the burst function is inputted and the address $A_{R1}$ indicating the row address is inputted to the buffer 12. The row address buffer 15 outputs the address $A_{R1}$ that had been input to the buffer 12 to the row decoder DR. Next, the first programming command $W_{B4}$ designating the burst length is inputted to the command controlling section 11, and a start address (column address) of the burst programming is stored in the buffer 12, and the external input data is stored in the buffer 14, respectively. Specifically, in FIG. 13, accompanying the triggering of a clock cycle t4, at a rising edge of the clock, the programming command $W_{B4}$ is fetched to the command controlling section 11, the write address $A_{C1}$ is fetched to the buffer 12, and the write data D0 is fetched to the buffer 14, respectively.

The subbank controlling section 21 of the device 1 of the present invention applies the erasing voltage pulse onto the memory cell designated by the write address $A_{C1}$ in the first subbank SB1 in the initial cycle (clock cycle t7 in FIG. 13) (step #201). Specifically, at time t7, the transistor T of the program target memory cell M in the first subbank SB1 indicated by the write address $A_{C1}$ is brought to the ON state, and the erasing voltage pulse for shifting the variable resistance element R to the erased state is applied.

At this occasion, since the write data D0 is "0" (branching to YES in step #202), the subbank controlling section 21 of the device 1 of the present invention applies the first programming voltage pulse on the memory cell M in the first subbank SB1 indicated by the write address $A_{C1}$ in the subsequent second cycle for the first time (corresponding to the second action cycle, clock cycle t8 in FIG. 13) (step #203).

Note that, at this occasion, in a case where the write data D0 is "1", (branching to NO in step #202), the subbank controlling section 21 of the device 1 of the present invention completes the erasing action on the memory cell M indicated by the write address $A_{C1}$ without applying the first programming voltage pulse during the time t8 to time t9. This applies similarly to the writing actions on the memory cells indicated by the write addresses $A_{C1+1}$ to $AC_{C1+3}$ and $A_{C2}$ to $A_{C2+3}$; in a case where the write data D1 to D7 corresponding to the respective writing addresses are "1", the subbank controlling section 21 completes the erasing actions on the memory cells M indicated by the aforesaid write addresses without applying the first programming voltage pulse after the application of the erasing voltage pulse.

At this occasion, further, parallel to the clock cycle t8, the subbank controlling section 21 of the device 1 of the present invention applies the erasing voltage pulse on the memory cell designated by the write address $A_{C1+1}$ in the second subbank SB2 (step #201).

Thereafter, in the subsequent first cycle (corresponding to the first action cycle, clock cycle t9 in FIG. 13), the subbank controlling section 21 of the device 1 of the present invention applies the erasing voltage pulse on the memory cell designated by the write address $A_{C1+2}$ in the first subbank SB1 (step #201). On the other hand, in parallel thereto, the first programming voltage pulse is applied to the memory cell designated by the write address $A_{C1+1}$ in the second subbank SB2 in accordance with the write data D1 (step #203).

Thereafter, in the subsequent second cycle (clock cycle t10), the subbank controlling section 21 of the device 1 of the present invention applies the first programming voltage pulse onto the memory cell designated by the write address $A_{C1+2}$ in the first subbank SB1 in accordance with the write data D2 (step #203). On the other hand, in parallel thereto, the erasing voltage pulse is applied to the memory cell designated by the write address $A_{C1+3}$ in the second subbank SB2 (step #201).

Thereafter, in the clock cycle t11, in order to determine whether or not the resistance property of the programmed memory cell is within the desired resistance distribution range with respect to the memory cell designated by the write address $A_{C1}$ of the first subbank SB1, the subbank controlling section 21 of the device 1 of the present invention performs the program verifying action (step #204). Specifically, the program target cell M in the first subbank SB1 indicated by the write address $A_{C1}$ is read, and the read data Q0 is outputted as data DatC. On the other hand, in parallel thereto, the subbank controlling section 21 applies the first programming voltage pulse on the memory cell designated by the write address $A_{C1+3}$ in the second subbank SB2 in accordance with the write data D3 (step #203).

Similarly, in the clock cycle t12, the subbank controlling section 21 performs the program verifying action on the memory cell designated by the write address $A_{C1+1}$ in the second subbank SB2 (step #204), performs the program verifying action on the memory cell designated by the write address $A_{C1+2}$ in the first subbank SB1 in the clock cycle t13, and performs the program verifying action on the memory cell designated by the write address $A_{C1+3}$ in the second subbank SB2 in the clock cycle t14.

At this occasion, the comparing section 17 of the device 1 of the present invention compares a value of the data DatC read in the program verifying action in the previous cycle and a value of a signal DatO (e.g., in the clock cycle t11, values of the data Q0 and the data D0), and outputs the result thereof as a result signal Comp to the programming/erasing section 19. For example, in the clock cycle t12, "Err0" indicating that the values of the data Q0 and the data D0 do not match is outputted as the result signal Comp.

Then, the programming/erasing section 19 of the device 1 of the present invention determines whether or not the programming action on the program target cell M had been performed normally based on the result signal Comp outputted from the comparing section 17 in the previous cycle (step #205), and in a case where it is determined as not having been completed normally (branching to NO in step #205), a signal WE indicating that the programming action did not complete normally, a signal AddOw indicating an address of the program target cell M, and a signal DatOw indicating the write data are outputted to the subbank controlling section 21. Specifically, in the clock cycle t13, since the result signal Comp outputted from the comparing section 17 in the previous cycle is "Err0", the programming/erasing section 19 determines that the result of the program verifying action is "Fail", and outputs the signal WE, the signal AddOw indicating the address $A_{C1}$, and the signal DatOw indicating the data D0 to the subbank controlling section 21.

Thereafter, in the clock cycle t14, in response to the signal WE having been "Fail" in the previous cycle, the subbank controlling section 21 applies the erasing voltage pulse on the memory cell M designated by the write address $A_{C1}$ in the first subbank SB1 so as to perform the programming action again (step #206). At this occasion, in parallel thereto, the program verifying action on the memory cell designated by the write address $A_{C1+3}$ in the second subbank SB2 is being performed.

In the example shown in FIG. 13, since the programming action has failed for all of the memory cells designated by the write addresses $A_{C1}$ to $A_{C1+3}$, the erasing voltage pulse is subsequently applied to the memory cells (step #206), and the second programming voltage pulse is applied to the memory cells (step #207).

Firstly, in the fourth cycle for the first time (corresponding to a fourth action cycle, the clock cycle t15 of FIG. 13), the subbank controlling section 21 of the device 1 of the present invention applies the second programming voltage pulse on the memory cell M designated by the write address $A_{C1}$ in the first subbank SB1 in accordance with the write data D0 (step #207). On the other hand, in parallel thereto, the erasing voltage pulse is applied to the memory cell designated by the write address $A_{C1+1}$ in the second subbank SB2 (step #206).

Thereafter, in the subsequent third cycle (corresponding to the third action cycle, the clock cycle t16 of FIG. 13), the subbank controlling section 21 of the device 1 of the present invention applies the erasing voltage pulse on the memory cell designated by the write address $A_{C1+2}$ in the first subbank SB1 (step #206). On the other hand, in parallel thereto, the second programming voltage pulse is applied to the memory cell designated by the write address $A_{C1+1}$ in the second subbank SB2 in accordance with the write data D1 (step #207).

Thereafter, in the subsequent fourth cycle (clock cycle t17), the subbank controlling section 21 of the device 1 of the present invention applies the second programming voltage pulse on the memory cell designated by the write address $A_{C1+2}$ in the first subbank SB1 in accordance with the write data D2 (step #207). On the other hand, in parallel thereto, the erasing voltage pulse is applied to the memory cell designated by the write address $A_{C1+3}$ in the second subbank SB2 (step #206).

Thereafter, in the clock cycle t18, the subbank controlling section 21 of the device 1 of the present invention performs the program verifying action on the memory cell designated by the write address $A_{C1}$ in the first subbank SB1 to determine whether or not the resistance property of the programmed memory cell is within the desired resistance distribution range (step #205). On the other hand, in parallel thereto, the subbank controlling section 21 applies the second programming voltage pulse on the memory cell designated by the write address $A_{C1+3}$ in the second subbank SB2 in accordance with the write data D3 (step #207).

Similarly, in the clock cycle t19, the subbank controlling section 21 performs the program verifying action on the memory cell designated by the write address $A_{C1+1}$ in the second subbank SB2 (step #205), performs the program verifying action on the memory cell designated by the write address $A_{C1+2}$ in the first subbank SB1 in the clock cycle t20, and performs the program verifying action on the memory cell designated by the write address $A_{C1+3}$ in the second subbank SB2 in the clock cycle t21.

As a result of this, a case is assumed in which although the programming of the memory cells designated by the write addresses $A_{C1}$, $A_{C1+2}$ has been completed normally, the programming of the memory cells designated by the write addresses $A_{C1+1}$ and $A_{C1+3}$ has failed. In such an occasion, "Pass0" indicating that the values of the data Q0 and the data D0 match is outputted in the clock cycle t19 as the result signal Comp, and "Pass2" indicating that the values of the data Q2 and the data D2 match is outputted in the clock cycle t21 as the result signal Comp (branching to YES in step #205). On the other hand, "Err1" indicating that the values of the data Q1 and the data D1 do not match is outputted in the clock cycle t20 as the result signal Comp, and "Err3" indicating that the values of the data Q3 and the data D3 do not match is outputted in the clock cycle t22 as the result signal Comp (branching to NO in step #205).

Due to this, the programming/erasing section 19 determines that the result of the program verifying action for the memory cell designated by the write address $A_{C1+1}$ is "Fail" in the clock cycle t21, and outputs the signal WE, the signal AddOw indicating the address $A_{C1+1}$, and the signal DatOw indicating the data D1 to the subbank controlling section 21. Similarly, during the time t23 to t24 of FIG. 14, the programming/erasing section 19 determines that the result of the program verifying action for the memory cell designated by the write address $A_{C1+3}$ is "Fail", and outputs the signal WE, the signal AddOw indicating the address $A_{C1+3}$, and the signal DatOw indicating the data D3 to the subbank controlling section 21.

On the other hand, in the clock cycle t20 and the clock cycle t22, since the result signal Comp outputted from the comparing section 17 in the previous cycle is "Pass", it is determined that the programming action was completed normally for the program target cells M indicated by the write addresses $A_{C1}$ and $A_{C1+2}$, and the output of the signal WE, etc. to the subbank controlling section 21 is not performed.

In the clock cycle t21, the subbank controlling section 21 starts the writing action on the memory cell designated by the write address $A_{C2}$ in the first subbank SB1. That is, the erasing voltage pulse is applied to the memory cell designated by the write address $A_{C2}$ (step #201). At this occasion, in parallel thereto, the program verifying action on the memory cell designated by the write address $A_{C1+3}$ in the second subbank SB2 is being performed.

Thereafter, in the clock cycle t22 (corresponding to the second action cycle), the subbank controlling section 21 applies the first programming voltage pulse on the memory cell M designated by the write address $A_{C2}$ in the first subbank SB1 in accordance with the write data D4 (step #202). On the other hand, in parallel thereto, the subbank controlling section 21 applies the erasing voltage pulse on the memory cell designated by the write address $A_{C1+1}$ in the second subbank SB2 (step #206).

Thereafter, in the clock cycle t23 (corresponding to the third action cycle), the subbank controlling section 21 applies the erasing voltage pulse on the memory cell M designated by the write address $A_{C2+2}$ in the first subbank SB1 (step #206). On the other hand, in parallel thereto, the subbank controlling section 21 applies the second programming voltage pulse on the memory cell designated by the write address $A_{C1-1}$ in the second subbank SB2 (step #207).

Thereafter, in the clock cycle t24 (corresponding to the second action cycle), the subbank controlling section 21 applies the first programming voltage pulse on the memory cell M designated by the write address $A_{C2+2}$ in the first subbank SB1 in accordance with the write data D6 (step #202). On the other hand, in parallel thereto, the subbank controlling section 21 applies the erasing voltage pulse on the memory cell designated by the write address $A_{C1+3}$ in the second subbank SB2 (step #206).

Thereafter, in the clock cycle t25, the subbank controlling section 21 of the device 1 of the present invention performs the program verifying action on the memory cell designated by the write address $A_{C2}$ in the first subbank SB1 to determine whether or not the resistance property of the programmed memory cell is within the desired resistance distribution range (step #205). On the other hand, in parallel thereto, the subbank controlling section 21 applies the second programming voltage pulse on the memory cell designated by the write address $A_{C1+3}$ in the second subbank SB2 in accordance with the write data D3 (step #207).

Similarly, in the clock cycle t26, the subbank controlling section 21 performs the program verifying action on the memory cell designated by the write address $A_{C1+1}$ in the second subbank SB2 (step #204), performs the program verifying action on the memory cell designated by the write address $A_{C2+2}$ in the first subbank SB1 in the clock cycle t27, and performs the program verifying action on the memory cell designated by the write address $A_{C1+3}$ in the second subbank SB2 in the clock cycle t28. As a result of this, a case is assumed in which although the programming of the memory cells designated by the write addresses $A_{C2}$, $A_{C1+1}$, and $A_{C1+3}$ has been completed normally, the programming of the memory cell designated by the write address $A_{C2+2}$ has failed.

When "Err6" indicating that the values of the data Q6 and the data D6 do not match is outputted in the clock cycle t28 as the result signal Comp (branching to NO in step #205), the programming/erasing section 19 determines that the result of the program verifying action for the memory cell designated by the write address $A_{C2+2}$ is "Fail" in the clock cycle t29, and outputs the signal WE, the signal AddOw indicating the address $A_{C2+2}$, and the signal DatOw indicating the data D6 to the subbank controlling section 21.

In the clock cycle t29, the subbank controlling section 21 starts the writing action on the memory cell designated by the write address $A_{C2+1}$ in the second subbank SB2. That is, the erasing voltage pulse is applied to the memory cell designated by the write address $A_{C2+1}$ (step #201).

Thereafter, in the clock cycle t30 (corresponding to the first action cycle), the subbank controlling section 21 applies the erasing voltage pulse on the memory cell M designated by the write address $A_{C2+2}$ in the first subbank SB1 (step #206). On the other hand, in parallel thereto, the subbank controlling section 21 applies the first programming voltage pulse on the memory cell designated by the write address $A_{C2+1}$ in the second subbank SB2 in accordance with the write data D5 (step #203).

Thereafter, in the clock cycle t31 (corresponding to the fourth action cycle), the subbank controlling section 21 applies the second programming voltage pulse on the memory cell M designated by the write address $A_{C2+2}$ in the first subbank SB1 in accordance with the write data D6 (step #207). On the other hand, in parallel thereto, the subbank controlling section 21 applies the erasing voltage pulse on the memory cell designated by the write address $A_{C2+3}$ in the second subbank SB2 (step #201).

Accordingly, by alternately switching the subbank to which the programming voltage pulse is applied and the subbank to which the erasing voltage pulse is applied, the latency of the programming action can be shortened.

Second Embodiment

A programming action processing method of the device 1 of the present invention different from the above first embodiment will be described hereinbelow. In the present embodiment, the configuration of the controlling circuit 10 is somewhat different from that of the first embodiment; it is provided with a controlling circuit 10b configured so as to be capable of random writing processing.

Similar to the controlling circuit of the first embodiment, the controlling circuit 10b is configured by including the command controlling section 11, the buffer 12, the output controlling section 13, the buffer 14, the row address buffer 15, the reading section 16, the comparing section 17, the buffer 18, the programming/erasing section 19, the action-switch controlling section 20 and the subbank controlling section 21, however, it is configured so as to be capable of controlling respective actions including the programming action, the erasing action and the second programming action by simultaneously receiving all of the addresses including the column addresses and the row addresses as the address signal inputted from the outside, and selecting arbitrary memory cells M identified from all of the addresses in random.

Figure 15:
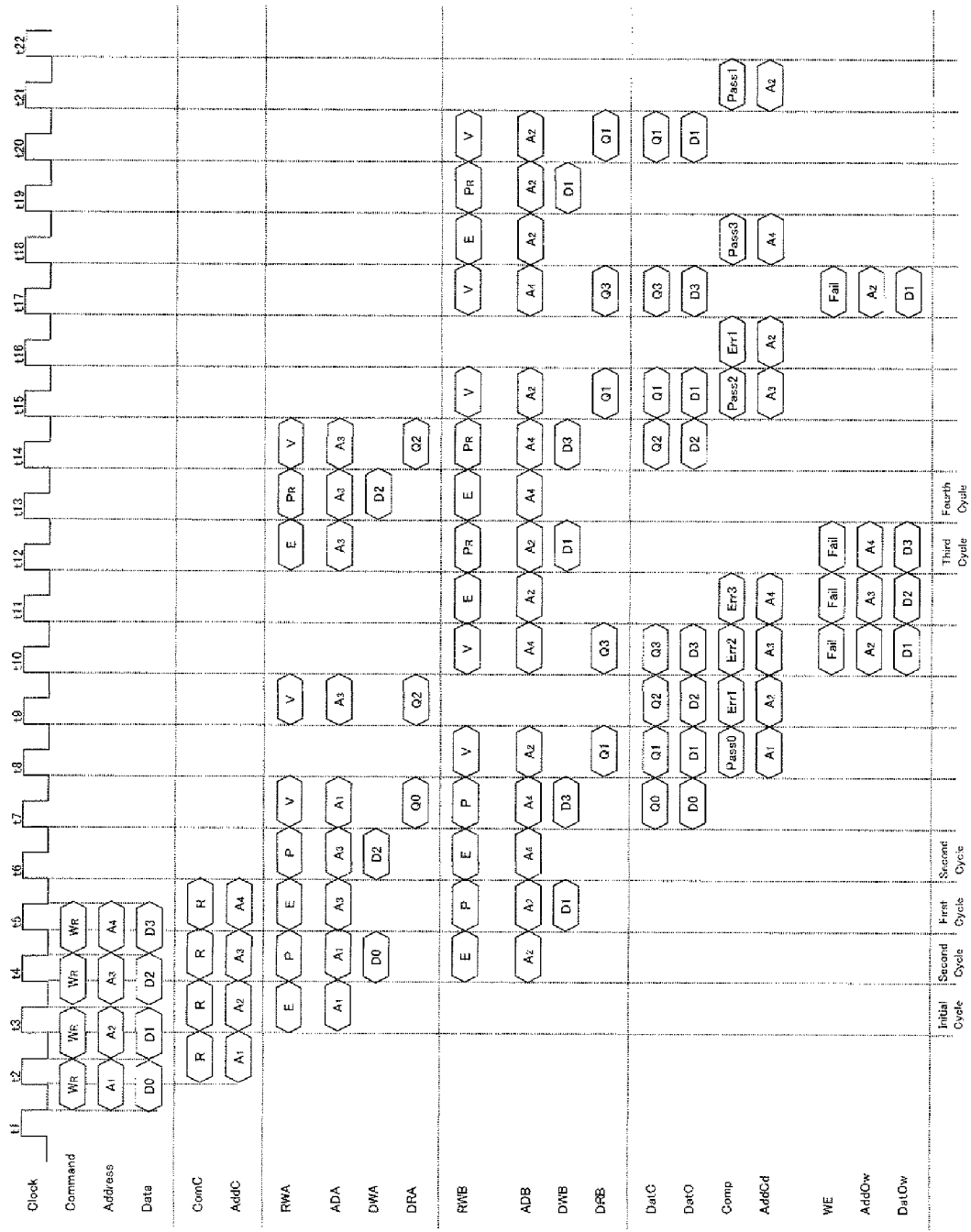
FIG. 15 is a timing chart showing an example of processes of a random writing action in the semiconductor memory device of the present invention.

Hereinbelow, processes in the random writing action of the device 1 of the present invention will be explained with reference to FIG. 9 and FIG. 15. FIG. 15 is a timing chart for a case of performing the random writing action in the device 1 of the present invention. Similar to FIG. 13 and FIG. 14, the clock cycles t1 to t22 are respectively started at a raising timing of each clock, and a triggering time of each clock cycle ti (i=1 to 22) is referred to as time ti.

Note that, in the present embodiment, for the sake of explanation, a case in which four addresses $A_1$ to $A_4$ including row addresses and column addresses are selected in random, and external input data D0 to D3 are input with respect to the respective addresses $A_1$ to $A_4$ will be explained. Further, a case in which the programming voltage pulse is applied to memory cells M designated by the respective addresses $A_1$ to $A_4$ to program to the programmed state of "0" will be explained. That is, a case where the external input data D0 to D3 are "0000" will be explained as an example. Further, it is assumed that the addresses $A_1$ and $A_3$ belong to the first subbank SB1, and the addresses $A_2$ and $A_4$ belong to the second subbank SB2.

In the device 1 of the present invention of the present embodiment, the writing action is started when a random writing command $W_R$ is inputted to the command controlling section 11, the address $A_1$ is inputted to the buffer 12 and the write data D0 is inputted to the buffer 14 (time t2, step #200). The row address buffer 15 extracts a row address from the address $A_1$ that had been inputted to the buffer 12, and sends the row address to the row decoder DR.

Note that, in the present embodiment, the device 1 of the present invention is configured in which the word lines belonging to the first subbank SB1 and the word lines belonging to the second subbank SB2 connecting to the row decoder DR are independent, and a configuration in which the voltage can be applied independently to the memory cells belonging to the first subbank SB1 and to the memory cells belonging to the second subbank SB2.

Further, in the clock cycle t3 of FIG. 15, the subbank controlling section 21 of the device 1 of the present invention applies the erasing voltage pulse on the memory cell designated by the write address $A_1$ in the first subbank SB1 (step #201). More specifically, at time t3, after the transistor T of the program target memory cell M in the first subbank SB1 designated by the write address $A_1$ is brought to the ON state, the erasing voltage pulse for shifting the variable resistance element R to the erased state is applied.

At this occasion, since the write data D0 is "0" (branching to YES in step #202), the subbank controlling section 21 of the device 1 of the present invention applies the first programming voltage pulse on the memory cell M in the first subbank SB1 indicated by the write address $A_1$ in the clock cycle t4 (step #203).

Note that, at this occasion, in a case where the write data D0 is "1", (branching to NO in step #202), the subbank controlling section 21 of the device 1 of the present invention completes the erasing action on the memory cell M indicated by the write address $A_1$ without applying the first programming voltage pulse in the clock cycle t4. This applies similarly to the writing actions on the memory cells M indicated by the write addresses $A_2$ to $A_4$; in a case where the write data D1 to D3 corresponding to the respective writing addresses are "1", the subbank controlling section 21 completes the erasing actions on the memory cells M indicated by the aforesaid write addresses without applying the first programming voltage pulse after the application of the erasing voltage pulse.

On the other hand, at time t3, a subsequent random writing command $W_R$ is inputted to the command controlling section 11, the address $A_2$ is inputted to the buffer 12 and the write data D1 is inputted to the buffer 14. In response to this, in the clock cycle t4, the subbank controlling section 21 applies the erasing voltage pulse to the memory cell designated by the write address $A_2$ in the second subbank SB2 in parallel to the application of the first programming voltage pulse in the first subbank SB1 (step #201).

Further, at time t4, a subsequent random writing command $W_R$ is inputted to the command controlling section 11, the address $A_3$ is inputted to the buffer 12 and the write data D2 is inputted to the buffer 14. At this occasion, since the application of the first programming voltage pulse to the memory cell designated by the write address $A_1$ in the first subbank SB1 (step #203) is completed in the clock cycle t4, the subbank controlling section 21 applies the erasing voltage pulse to the memory cell designated by the write address $A_3$ in the first subbank SB1 (step #201) in the clock cycle t5 in parallel to the application of the first programming voltage pulse to the memory cell designated by the write address $A_2$ in the second subbank SB2 (step #203).

Further, at time t5, a subsequent random writing command $W_R$ is inputted to the command controlling section 11, the address $A_4$ is inputted to the buffer 12 and the write data D3 is inputted to the buffer 14. At this occasion, since the application of the first programming voltage pulse to the memory cell designated by the write address $A_2$ in the second subbank SB2 (step #203) is completed in the clock cycle t5, the subbank controlling section 21 applies the erasing voltage pulse to the memory cell designated by the write address $A_4$ in the second subbank SB2 (step #201) in the clock cycle t6 in parallel to the application of the first programming voltage pulse to the memory cell designated by the write address $A_3$ in the first subbank SB1 (step #203).

Explanations on processing operations of clock cycle t7 and thereafter will be omitted, since they are substantially similar to the processing operations of the above first embodiment as explained with reference to FIG. 13 and FIG. 14.

Figure 16:
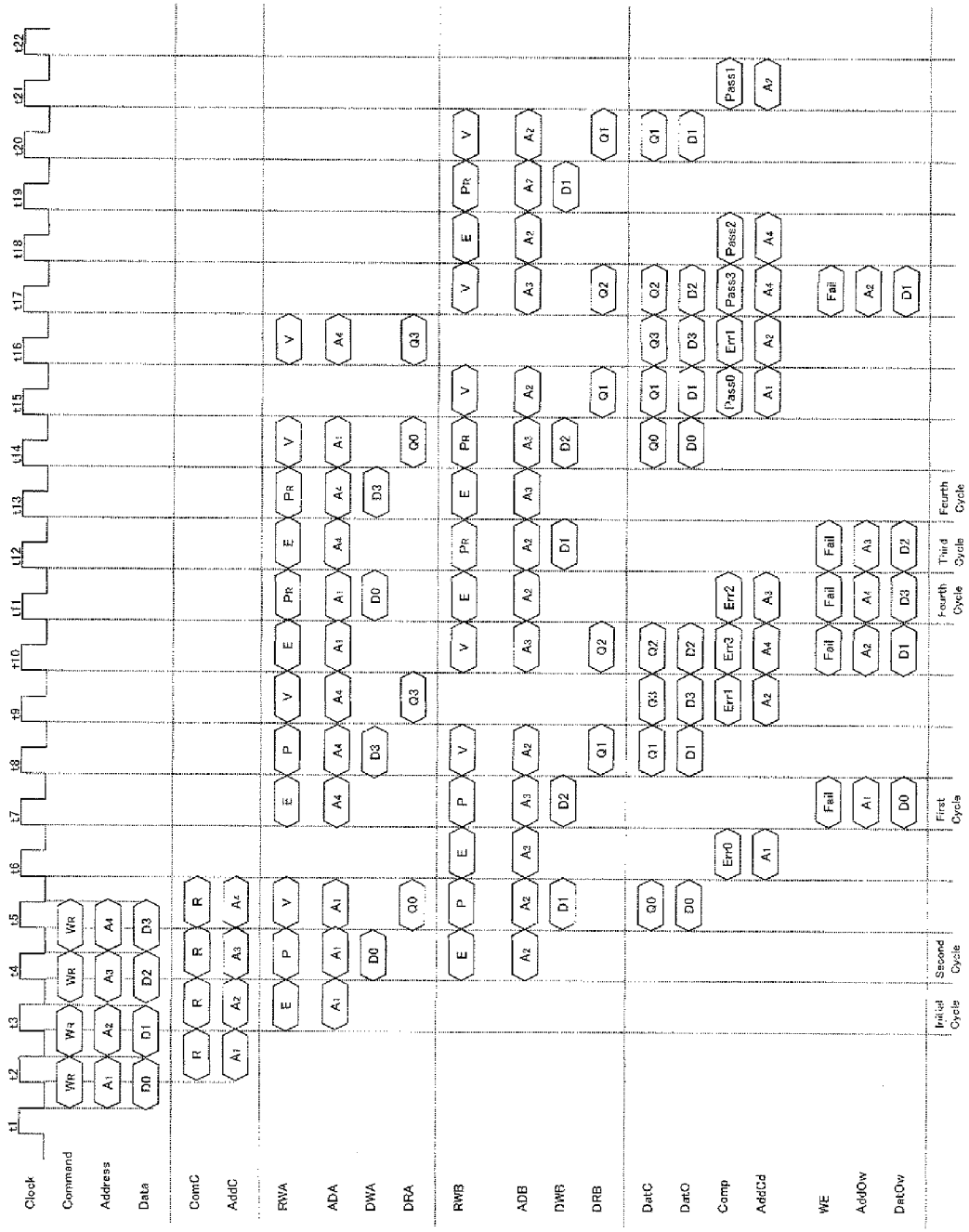
FIG. 16 is a timing chart showing another example of the processes of the random writing action in the semiconductor memory device of the present invention.

Hereinbelow, other processing operations in the random writing action of the device 1 of the present invention will be explained. FIG. 16 is a timing chart for a case in which in the random writing actions for the aforementioned addresses $A_1$ to $A_4$, the addresses $A_1$ and $A_4$ belong to the first subbank SB1, and the addresses $A_2$ and $A_3$ belong to the second subbank SB2. As for the operations until the clock cycle t3, they are similar to FIG. 15.

At time t4 of FIG. 16, a random writing command $W_R$ is inputted to the command controlling section 11, the address $A_3$ is inputted to the buffer 12 and the write data D2 is inputted to the buffer 14. However, the address $A_3$ belongs to the second subbank SB2, and since the application of the first programming voltage pulse to the memory cell designated by the write address $A_2$ in the second subbank SB2 in the clock cycle t5 is being performed, the subbank controlling section 21 applies the erasing voltage pulse to the memory cell designated by the write address $A_3$ in the second subbank SB2 after the completion of the application of the first programming voltage pulse onto the memory cell in the second subbank SB2. That is, the erasing voltage pulse is applied to the memory cell designated by the write address $A_3$ in the second subbank SB2 in the clock cycle t6.

Further, at time t5, a random writing command $W_R$ is inputted to the command controlling section 11, the address $A_4$ is inputted to the buffer 12 and the write data D3 is inputted to the buffer 14. The address $A_4$ belongs to the first subbank SB1, and at time t6, the application of the first programming voltage pulse onto the memory cell designated by the write address $A_1$ in the first subbank SB1 has already been completed. However, since the application of the erasing voltage pulse to the memory cell designated by the write address $A_3$ in the second subbank SB2 is being performed in the clock cycle t6, the subbank controlling section 21 performs the program verifying action in the clock cycle t5 on the memory cell designated by the write address $A_1$ in the first subbank SB1 in advance, and then in the clock cycle t7, applies the erasing voltage pulse to the memory cell designated by the write address $A_4$ in the first subbank SB1 in parallel with the application of the first programming voltage pulse to the memory cell in the second subbank SB2.

Explanations on other processing operations will be omitted, since they are substantially similar to the processing operations of FIG. 13 to FIG. 15.

In the present embodiment also, by alternately switching the subbank onto which the programming voltage pulse is to be applied and the subbank onto which the erasing voltage pulse is to be applied in the random writing action, the latency in the programming action can be shortened.

Hereinbelow, other embodiments will be explained.

(1) In the above embodiments, the explanation has been given of the case in which the memory cell array is formed of two subbanks, however, the present invention is not limited by this. The memory cell array may include even a larger number of subbanks.

(2) In the above embodiments, the detailed description has been given taking the case of performing the writing on the memory cells in the memory cell array of FIG. 2 as an example, however, the present invention is not limited by the configuration of a memory cell array, and may be applied to an arbitrary memory array including a variable resistance element formed of metal oxide in a memory cell, and a desired number of the memory cells.

(3) Although specific values are given as the resistance properties in the low resistance state and the high resistance state in FIG. 3, these are examples of electric resistance values of the variable resistance elements in the present embodiments, and do not limit the properties of the variable resistance elements. The present invention can be applied to any element having a plurality of different electric resistance states of two states or more. Further, the voltage values of the read voltages and the writing voltage pulses used for the programming action and the erasing action are specific examples for explaining the present invention, and do not limit the property of the variable resistance element. Further, in the present embodiments, although the programming action is performed by applying the voltage pulse from the lower electrode with the upper electrode side as a reference, and the erasing action is performed by applying the voltage pulse from the upper electrode with the lower electrode side as a reference, these do not limit the properties of the variable resistance elements; depending on the material used for the variable resistance elements, the electrode to which the voltage pulse is applied and the electrode to which the reference voltage is applied may be opposite in the programming action and the reading action.

(4) In the above embodiment, although a driving method, typically referred to as bipolar operation, in which the resistance value of the variable resistance element is increased (high resistance state) or decreased (low resistance state) by applying, to the variable resistance element, the programming voltage pulse and the erasing voltage pulse that have opposite polarities has been exemplified, the present invention is not limited to the bipolar operation. Even with a driving method, referred to as a unipolar operation, in which the resistance value of the variable resistance element is increased (high resistance state) or decreased (low resistance state) by applying, to the variable resistance element, the programming voltage pulse and the erasing voltage pulse having the same polarity, the present invention can be applied so long as the element includes the overwriting durability against the application of the writing voltage pulse of either the programming voltage pulse or the erasing voltage pulse. In such a case, a diode may be used as the current controlling element. At this time, one of anode and cathode of the diode is connected to one terminal of the variable resistance element, the other is connected to the word line, and the other terminal of the variable resistance element not connected to the diode is connected to a bit line. The relationship between the word lines and the bit lines may be the opposite.

(5) Further, in the above embodiment, although binary variable resistance elements having two states of the low resistance state and the high resistance state as the resistance states have been described in detail, the present invention is not limited to the binary variable resistance elements. It can be applied to variable resistance elements that can retain three or more resistance states. In such a case, among the three or more resistance states, the lowest resistance state is the erased state, and the other states are the programmed state. In the programming action, after having applied the erasing voltage pulse, the programming voltage pulse that is controlled so that the resistance property is to be within the desired resistance distribution range of the resistance state is applied. Thereafter, as shown in the above first embodiment, the application of the erasing voltage pulse and the application of the second programming voltage pulse are repeated until the resistance property of the programming target variable resistance element is brought to be within the desired resistance distribution range of the resistance state. As shown in FIG. 10 or FIG. 11, since when the application voltage or the application current of the second programming voltage pulse is increased in steps, the resistance value of the variable resistance element gradually increases, the programming can be performed to an arbitrary programmed state by completing the programming action upon reaching the desired resistance distribution range.

(6) In the above embodiments, although cases in which the control circuit 10 controls the writing action for each subbank according to the timing charts shown in FIG. 13 to FIG. 16 have been explained in detail, the present invention is not limited to these, and the present invention can be adapted at an operational timing corresponding to the controlling circuit even if the configuration of the controlling circuit is different.

(7) In the above embodiments, although the case of the variable resistance element using hafnium oxide as the variable resistor has been described as the example, the present invention is not limited to this. As for the property of the metal oxide variable resistance element, the state in which the metal oxide is an insulating film is the high resistance state, and a dielectric breakdown occurs as a result of continuously applying voltages to the insulating film. This is an inevitable phenomenon that occurs sooner or later by application of electric stress as long as voltages are continuously applied to the insulating film although the applying time and voltage characteristics vary among elements. Due to this, in the programming action, etc., when the voltage that would cause the high resistance state element to further be in the high resistance is kept applied (overwritten), the dielectric breakdown occurs sooner or later, and the resistance is lowered. The programming scheme of the present invention is useful in materials having such a property. Accordingly, the metal oxide that can be used as the variable resistor in the present invention is not limited to the oxide of Hf; and the present invention can be adapted with e.g., the oxynitride of Hf, or a metal oxide or oxynitride of at least one of Al, Ni, Co, Ta, Zr, W, Ti, Cu, V, Zn and Nb. Moreover, if one of the high resistance state with the highest resistance value and the low resistance state with the lowest resistance value among the respective resistance states of the variable resistance element has the above overwriting durability, the present invention can be adapted to the element with the resistance state of the side having the overwriting durability as the erased state.

The present invention can be used in semiconductor memory devices, and especially can be used in a non-volatile semiconductor memory device configured by including variable resistance elements in which the resistance state transitions by the application of the electric stress, and uses the resistance state after the transition for storing information.

Although the present invention has been described in terms of the preferred embodiment, it will be appreciated that various modifications and alternations might be made by those skilled in the art without departing from the spirit and scope of the invention. The invention should therefore be measured in terms of the claims which follow.

What is claimed is:

1. A semiconductor memory device comprising:
   a memory cell array formed of memory cells, a plurality of which is arranged respectively in a row direction and a column direction, each memory cell including a variable resistance element in which an electrode is supported at each of two terminals of a variable resistor, a resistance state is defined by a resistance property between the two terminals and transitions between two or more different resistance states by applying electric stress between the two terminals, and one resistance state after the transition is used for storing information, wherein
   the memory cell array is divided into a plurality of subbanks,
   each of the subbanks comprises:
   common word lines each connecting the memory cells in the same row, and common bit lines each connecting the memory cells in the same column;
   a row decoder that applies a voltage to the word lines of the subbank; and
   a column decoder that applies a voltage to the bit lines of the subbank,
   in a writing of selected memory cells in the memory cell array,
   one of an erasing action and a programming action is performed on each of the selected memory cells,
   in the erasing action, an erasing voltage pulse for transitioning the resistance state of the variable resistance element of the memory cell to an erased state having a lowest resistance value is applied to the selected memory cell, regardless of the resistance state of the variable resistance element of the selected memory cell, and
   in the programming action, the erasing voltage pulse is applied to the selected memory cell, and a first programming voltage pulse for transitioning the resistance state of the variable resistance element of the memory cell from the erased state to a predetermined resistance state is applied to the selected memory cell, regardless of the resistance state of the variable resistance element of the selected memory cell, and
   the semiconductor memory device further comprises a control circuit that controls an application of the first programming voltage pulse in the programming action to one of two memory cells, and an application of the erasing voltage pulse in the erasing action or the programming action to the other of the two memory cells so that the applications are performed in an identical action cycle with respect to the two memory cells, which belong to the different subbanks, of the selected memory cells.

2. The semiconductor memory device according to claim 1, wherein
   an initial verifying action of reading the resistance state of the variable resistance element of the selected memory cell is not performed prior to performing the erasing action or the programming action.

3. The semiconductor memory device according to claim 1, wherein
   the control circuit performs a verifying action of verifying whether or not the resistance property of the variable resistance element of the memory cell selected as a programming target is within a resistance distribution range of the predetermined resistance state after the application of the first programming voltage pulse,
   in a case where the selected memory cell of which the resistance property of the variable resistance element is outside the resistance distribution range of the predetermined resistance state is detected in the verifying action,
   the control circuit repeatedly performs a second programming action until the resistance property of the variable resistance element of the memory cell that is outside the resistance distribution range is brought to be within the resistance distribution range of the predetermined resistance state, and
   in the second programming action, regardless of the resistance state of the variable resistance element of the memory cell that is outside the resistance distribution range, the erasing voltage pulse is applied to the memory cell, and a second programming voltage pulse for transitioning the resistance state of the variable resistance element of the memory cell that is outside the resistance distribution range from the erased state to the predetermined resistance state is applied to the memory cell.

4. The semiconductor memory device according to claim 3, wherein
   in the case where the second programming action is repeated for a plurality of times,
   in the second programming action for a first time,
   the second programming voltage pulse is set to have a smaller absolute value of a voltage amplitude than that of the first programming voltage pulse, or to have a smaller amount of current flow in the variable resistance element when the second programming voltage pulse is applied than when the first programming voltage pulse is applied, and in the second programming action for second and subsequent times, the control circuit increases the absolute value of the voltage amplitude of the second programming voltage pulse or the amount of current flowing in the variable resistance element when the second programming voltage pulse is applied, in steps as a number of times the second programming action is performed increases.

5. The semiconductor memory device according to claim 1, wherein the memory cell array includes one or more pairs of the subbanks constituted of the first subbank and the second subbank, and in the writing of the selected memory cells in the memory cell array, the control circuit is configured to perform:

a first action cycle of applying the erasing voltage pulse to the memory cell in the first subbank selected as a target of the erasing action or the programming action and applying the first programming voltage pulse to the memory cell in the second subbank selected as a target of the programming action, and a second action cycle of applying the first programming voltage pulse to the memory cell in the first subbank selected as the target of the programming action and applying the erasing voltage pulse to the memory cell in the second subbank selected as the target of the erasing action or the programming action.

6. The semiconductor memory device according to claim 5, wherein the row decoder is shared between the first subbank and the second subbank in the pair of subbanks, the row decoder simultaneously applies the voltage to the corresponding word lines in the first subbank and the second subbank, and in the writing of the memory cells selected by the corresponding word lines in the first subbank and the second subbank, the bit lines in the first subbank, and the bit lines in the second subbank, in the pair of subbanks, the control circuit is configured to alternately perform the first action cycle and the second action cycle.

7. The semiconductor memory device according to claim 5, wherein the first action cycle and the second action cycle are performed in synchronization with an external clock.

8. The semiconductor memory device according to claim 3 wherein in the writing of the selected memory cells in the memory cell array, the control circuit performs the application of the second programming voltage pulse in the second programming action on the one of the two memory cells, and the application of the erasing voltage pulse in the erasing action, the programming action or the second programming action on the other of the two memory cells in the identical action cycle with respect to the two memory cells, which belong to the different subbanks, of the selected memory cells.

9. The semiconductor memory device according to claim 8, wherein the memory cell array includes a pair of the subbanks constituted of the first subbank and the second subbank, and in the writing of the selected memory cells in the memory cell array, the control circuit is configured to perform:

a third action cycle of applying the erasing voltage pulse to the memory cell in the first subbank selected as the target of the erasing action, the programming action, or the second programming action and applying the second programming voltage pulse to the memory cell in the second subbank selected as the target of the second programming action, and a fourth action cycle of applying the second programming voltage pulse to the memory cell in the first subbank selected as the target of the second programming action and applying the erasing voltage pulse to the memory cell in the second subbank selected as the target of the erasing action, the programming action, or the second programming action.

10. The semiconductor memory device according to claim 9, wherein the row decoder is shared between the first subbank and the second subbank in the pair of subbanks, the row decoder simultaneously applies the voltage to the corresponding word lines in the first subbank and the second subbank, and in the writing of the memory cells selected by the corresponding word lines in the first subbank and the second subbank, the bit lines in the first subbank, and the bit lines in the second subbank, in the pair of subbanks, the control circuit is configured to alternately perform the third action cycle and the fourth action cycle.

11. The semiconductor memory device according to claim 9, wherein the third action cycle and the fourth action cycle are performed in synchronization with an external clock.

12. The semiconductor memory device according to claim 1, wherein each of the memory cells includes a current controlling element connected to the electrode on one terminal of the variable resistor of the variable resistance element, and the current controlling element is a transistor having one of a source and a drain connected to the electrode on the one terminal of the variable resistor.

13. The semiconductor memory device according to claim 1, wherein each of the memory cells includes a current controlling element connected to the electrode on one terminal of the variable resistor of the variable resistance element, and the current controlling element is a diode element having one of an anode and a cathode connected to the electrode on the one terminal of the variable resistor.

14. The semiconductor memory device according to claim 1, wherein the variable resistor is configured by including a metal oxide or oxynitride of at least one of Al, Hf, Ni, Co, Ta, Zr, W, Ti, Cu, V, Zn and Nb.

* * * * *